United States Patent
Alrod et al.

(10) Patent No.: US 9,640,270 B2
(45) Date of Patent: May 2, 2017

(54) SYSTEM AND METHOD OF USING MULTIPLE READ OPERATIONS

(71) Applicant: SANDISK TECHNOLOGIES INC., Plano, TX (US)

(72) Inventors: Idan Alrod, Herzliya (IL); Eran Sharon, Rishon Lezion (IL)

(73) Assignee: SANDISK TECHNOLOGIES LLC, Plano, TX (US)

( * ) Notice: Subject to any disclaimer, the term of this patent is extended or adjusted under 35 U.S.C. 154(b) by 285 days.

(21) Appl. No.: 14/457,913

(22) Filed: Aug. 12, 2014

(65) Prior Publication Data

US 2016/0049203 A1 Feb. 18, 2016

(51) Int. Cl.
| | |
|---|---|
| *G11C 16/26* | (2006.01) |
| *G06F 11/07* | (2006.01) |
| *G11C 16/30* | (2006.01) |
| *G11C 16/34* | (2006.01) |
| *G11C 13/00* | (2006.01) |

(52) U.S. Cl.
CPC ............ *G11C 16/26* (2013.01); *G06F 11/073* (2013.01); *G06F 11/0793* (2013.01); *G11C 16/3422* (2013.01); *G11C 2013/0057* (2013.01)

(58) Field of Classification Search
CPC ................. G11C 16/26; G11C 16/3422; G11C 2013/0057; G06F 11/073; G06F 11/0793
See application file for complete search history.

(56) References Cited

U.S. PATENT DOCUMENTS

| | | | |
|---|---|---|---|
| 7,535,765 B2 | 5/2009 | Maayan | |
| 7,738,201 B2 | 6/2010 | Jin et al. | |
| 8,670,955 B2 | 3/2014 | Sun et al. | |
| 2002/0028541 A1* | 3/2002 | Lee | G11C 16/3427 438/149 |
| 2002/0071504 A1 | 6/2002 | Chen et al. | |
| 2008/0056005 A1 | 3/2008 | Aritome | |
| 2014/0056056 A1* | 2/2014 | Takagi | G11C 13/0007 365/148 |
| 2014/0269090 A1* | 9/2014 | Flynn | G11C 16/14 365/185.19 |
| 2014/0281128 A1* | 9/2014 | Krishnan | G06F 12/0246 711/103 |
| 2015/0378815 A1* | 12/2015 | Goda | G06F 11/1068 714/764 |

* cited by examiner

*Primary Examiner* — April Y Blair
*Assistant Examiner* — Dipakkumar Gandhi
(74) *Attorney, Agent, or Firm* — Toler Law Group, PC

(57) ABSTRACT

Systems and methods are described for reading a storage element of a memory. In a particular embodiment, a method, in a data storage device including a controller and a non-volatile memory, where the non-volatile memory includes a plurality of storage elements, includes performing multiple read operations at a storage element of the non-volatile memory. Each read operation of the multiple read operations is performed using the same reading voltage. The method further includes determining a read value of the storage element based on the multiple read operations.

46 Claims, 7 Drawing Sheets

SYSTEM AND METHOD OF USING MULTIPLE READ OPERATIONS

FIELD OF THE DISCLOSURE

The present disclosure is generally related to using multiple read operations.

BACKGROUND

Non-volatile data storage devices, such as embedded memory devices (e.g., embedded MultiMedia Card (eMMC) devices) and removable memory devices (e.g., removable universal serial bus (USB) flash memory devices and other removable storage cards), have allowed for increased portability of data and software applications. Users of non-volatile data storage devices increasingly rely on the non-volatile storage devices to store and provide rapid access to a large amount of data.

One or more read errors may occur in a memory, such as a flash memory, of a data storage device. For example, read values of memory cells may include errors based on noises that are statistical in nature (e.g., random noise factors, such as unknown noises) and that change from one read operation to a next read operation. Noises that are statistical in nature (e.g., statistical noises) are typically independent from regular programming noise and natural cell voltage distribution caused by programming procedures, program/erase (P/E) cycles, and/or data retention phenomena. The statistical noises may have a relatively low probability of occurrence, but may significantly impact a reading voltage (e.g., a sense voltage) and/or a voltage stored at a memory cell. For example, statistical noises may cause (e.g., result in) a voltage shift in a programmed voltage of a memory cell or in a reading voltage used during a read operation performed at the memory cell. Because of the random nature of statistical noises, the effects of statistical noises may be difficult to recognize (e.g., realize) when soft read operations are used to determine a programmed state (e.g., a stored voltage) of the memory cell or when a single read operation is used to determine the programmed state.

SUMMARY

Techniques are disclosed for using multiple read operations to read data from a memory, such as a non-volatile memory, of a data storage device. For example, the multiple read operations may be performed on a storage element (e.g., a memory cell) of the memory. Each of the multiple read operations may use the same reading voltage to determine a corresponding result. An output value (e.g., a programmed state of the storage element) may be determined based on a majority of the results (generated by the multiple read operations) that each have the same value. The results of the multiple read operations may be used to determine a reliability value associated with the determined output value. Additionally or alternatively, a voltage pulse may be applied to one or more word-lines of the memory prior to performing the multiple read operations. The voltage pulse may have a voltage value that is greater than the reading voltage used for the multiple read operations. The voltage pulse may result in a release of electrons that are trapped in oxide layers of one or more storage elements and that contribute to noise effects experienced at the storage element to be read.

By performing the multiple read operations on the storage element, a statistical noise may be taken into consideration during a read procedure, and/or a decode procedure associated with the storage element. For example, the effects of the statistical noise on the stored voltage of the storage element and/or on the reading voltage used to read the storage element may be observed (e.g., realized) based on the results of the multiple read operations and may be addressed through the use of a reliability value. Additionally, by using the same reading voltage when performing the multiple read operations, a number of the multiple read operations may be performed in a shorter time period than the same number of soft read operations that each use a different reading voltage. Accordingly, by performing the multiple read operations using the same reading voltage, statistical noise effects may be overcome (e.g., compensated for) when determining a state (e.g., a stored voltage value corresponding to a bit value) of the storage element.

DETAILED DESCRIPTION

Particular embodiments of the present disclosure are described below with reference to the drawings. In the description, common features are designated by common reference numbers throughout the drawings.

Figure 1:
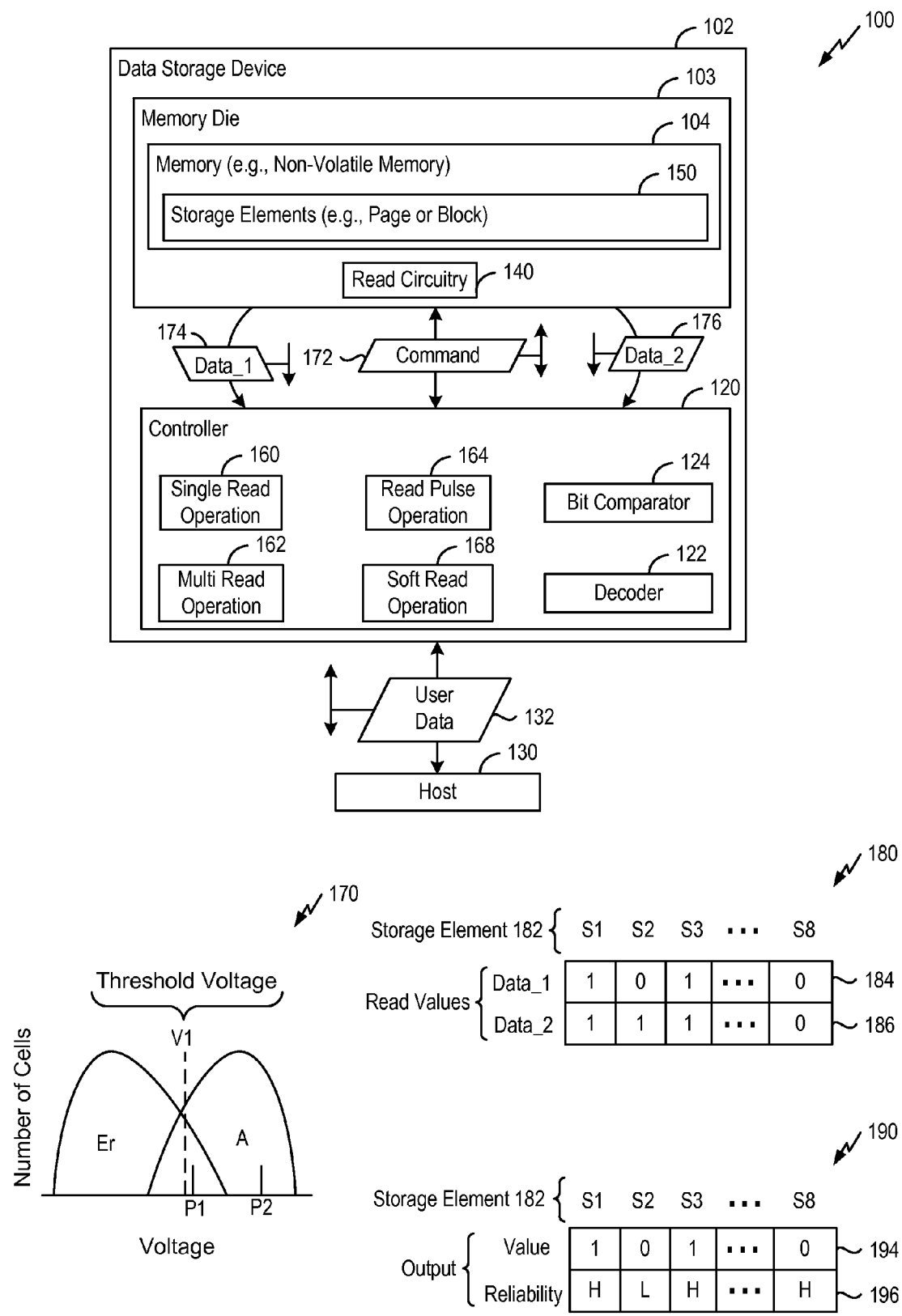
FIG. 1 is a block diagram of a particular illustrative embodiment of a system, including a data storage device that performs multiple read operations on a storage element to account for statistical noise.

FIG. 1 is a block diagram of a particular illustrative embodiment of a system 100 including a data storage device 102 coupled to an accessing device, such as a host device 130. The data storage device 102 may be coupled to the host device 130 via a communication path, such as a wired communication path and/or a wireless communication path. The data storage device 102 may be embedded within the host device 130, such as in accordance with an embedded MultiMedia Card (eMMC®) (trademark of Joint Electron Devices Engineering Council (JEDEC) Solid State Technology Association, Arlington, Va.) configuration. Alternatively, the data storage device 102 may be removable from (i.e., "removably" coupled to) the host device 130. For example, the data storage device 102 may be removably coupled to the host device 130 in accordance with a removable universal serial bus (USB) configuration. In some embodiments, the data storage device 102 may include or correspond to a solid state drive (SSD), which may be used as an embedded storage drive, an enterprise storage drive (ESD), or a cloud storage drive (CSD), as illustrative, non-limiting examples.

The host device 130 may include a processor and a memory. The memory may be configured to store data and/or instructions that may be executable by the processor. The memory may be a single memory or may include one or more memories, such as one or more non-volatile memories, one or more volatile memories, or a combination thereof. The host device 130 may issue one or more commands to the data storage device 102, such as one or more requests to read data from or write data to a memory 104 of the data storage device 102. For example, the host device 130 may send data, such as user data 132 to be written to the memory 104 of the data storage device 102.

The data storage device 102 includes a controller 120 coupled to the memory 104, such as a non-volatile memory. The controller 120 may be coupled to the memory 104 via a bus, an interface, another structure, or a combination thereof. The memory 104 may include a two dimensional memory configuration or a three dimensional (3D) memory configuration. The memory 104 may store data, such as a representation of the user data 132.

The memory 104 may be included on a memory die 103 that is separate from the controller 120 and coupled to the controller 120 (e.g., via a bus). However, in other implementations, the memory 104 and the controller 120 may be included on a common die. The memory 104 may include multiple blocks each having multiple pages of storage elements. The example of FIG. 1 depicts that the memory 104 includes a plurality of storage elements 150, which may correspond to a block, a page, or a word-line of the memory 104, as illustrative, non-limiting examples. Each storage element (e.g., memory cell or bit cell) of the storage elements 150 may be configured to store a data value (e.g., a bit value), such as "1" and "0." For example, each storage element may be programmable as a single-level cell (SLC) (e.g., a single bit per storage element) or a multi-level cell (MLC) (e.g., multiple bits per storage element).

The memory die 103 may further include read circuitry 140 and write circuitry (not shown) that are configured to enable operations of reading data from the storage elements 150 of the memory 104 and writing data to the storage elements 150 of the memory 104, respectively. The read circuitry 140 and the write circuitry may be separate components of the memory die 103 or may be included in a single component of the memory die 103.

When data is stored into the storage elements 150 configured as SLC storage elements, each storage element into which the data is stored may store a single-bit per storage element (e.g., each storage element is programmed to one of two states, such as states "Er" and "A"). A first graph 170 illustrates voltage states in a histogram showing a number of storage elements per state when the storage elements 150 are configured to store a single-bit per storage element. For example, the storage elements 150 are depicted in one of the voltage states "Er" and "A". The voltage state "Er" of the first graph 170 has a voltage value (corresponding to a data value of "1") and the voltage state "A" has a voltage value (corresponding to a data value of "0").

A first storage element of the storage elements 150 may be programmed to a first voltage P1 and a second storage element of the storage elements 150 may be programmed to a second voltage P2. When a threshold voltage V1 (e.g., a reading voltage) is applied to the first storage element and the second storage element, both of the first storage element and the second storage element may be determined to be in the programmed state (e.g., the state "A"). However, the second storage element having the second voltage P2 was most probably programmed to state "A" while the first storage element having the first voltage P1 has a non-negligible probability of having been initially programmed to the erase state (e.g., the state "Er"). For example, the first storage element having the first voltage P1 may have been initially set to the erase state (e.g., the state "Er"), but the voltage of the first storage element may have shifted to the first voltage P1 based on one or more noises, such as a static noise. Alternatively or additionally, the first storage element having the first voltage P1 may be determined to be in the erase state (e.g., the state "Er") when the threshold voltage V1 is set to read the first storage element but, due to statistical noise, the threshold voltage V1 is shifted to the right, such that the reading voltage used to read the first storage element is greater than the first voltage P1.

The controller 120 may receive data and commands (e.g., instructions) from the host device 130 and may send data (and commands) to the host device 130. The controller 120 may send data and commands, such as a command 172, to the memory 104 and may receive data from the memory 104. For example, the command 172 sent by the controller 120 to the memory 104 may include one or more write commands to store data, such as the user data 132, to a specified address of the memory 104. A write command may specify a physical address of a portion of the memory 104 (e.g., a physical address of a word-line of the memory 104) that is to store the data. The controller 120 is configured to send one or more read commands to the memory 104 to access data from a specified address of the memory 104. As an example, the command 172 sent by the controller 120 to the memory 104 may include a read command to access a representation of the user data 132 stored in the memory 104. The read command may specify the physical address of a portion of the memory 104 (e.g., a physical address of a word-line storing the user data 132).

The controller 120 may instruct (using one or more commands, such as the command 172) the memory 104 to read data from a particular storage element of the plurality of storage elements 150 in accordance with one or more operations, such as a single read operation 160, a multi read operation 162, or a soft bit read operation 168, as illustrative, non-limiting examples. Additionally, the controller 120 may instruct the memory to perform a read pulse operation 164, as described herein. The single read operation 160 may be associated with performing a single read operation (e.g., a sense operation) on the particular storage element. The single read operation 160 may use a reading voltage to read a voltage value stored at the particular storage element. For example, the reading voltage may include or correspond to the threshold voltage V1 of the graph 170.

The read pulse operation 164 may be associated with performing a read operation that applies a pulse voltage to one or more storage elements, such as a single read operation on one or more storage elements. The read pulse operation 164 is not configured to provide (e.g., generate) a read value for any of the one or more storage elements; rather, the read pulse operation 164 is configured to remove (e.g., alleviate) noise sources, such as electrons (e.g., a charge) trapped in oxide layers of the one or more storage elements. Accordingly, the read pulse operation 164 is distinct from the single read operation 160 and is performed at a higher read voltage than a reading voltage of the single read operation 160. For example, the read pulse operation 164 may be performed prior to performing a read operation on a particular storage element or after a read error generated by reading the particular storage element. To illustrate, the read pulse operation 164 may be performed on one or more storage elements included in the same and/or different word-line(s) or string(s) as a particular storage element to be read.

The soft bit read operation 168 may be associated with performing multiple read operations, each at a different read voltage, on the particular storage element. For example, the soft bit read operation 168 may include a first read operation based on the threshold voltage V1, followed by a second read operation based on the threshold voltage V1 plus a delta value, followed by a third read operation based on the threshold voltage V1 minus the delta value. If the results based on the first, second, and third read operations all have the same value, then an output value of the particular storage element may be determined to have a high reliability. However, if the results of the first, second, and third read operations do not all have the same value, then an output value of the particular storage element may be determined to have a low reliability. Using the soft bit read operation 168 may require at least three separate read operations to be performed, each read operation using a different reading voltage. To enable use of different reading voltages, one or more parameters of the data storage device 102 need to be set (e.g., modified) for each read operation. Illustrative parameters include a capacitor charging time parameter, a bit line bias voltage, a sense line bias voltage, an integration time, or a combination thereof, as illustrative, non-limiting examples. Although the soft bit read operation 168 is described as including three read operations, the soft bit read operation 168 may include or correspond to multiple read operations, such as two or more read operations.

The multi read operation 162 may be associated with performing multiple read operations, each at the same read voltage, on a particular storage element. For example, when a particular storage element is programmed as an SLC, the multi read operation 162 may include a first read operation based on the threshold voltage V1, followed by a second read operation based on the threshold voltage V1. If the results based on the first and second read operations have the same value, then an output value of the particular storage element may be determined to have a high reliability value.

If the results based on the first and second read operations have different result values, the different read results may be attributed to statistical noise and an output value may be determined in a predetermined manner. For example, when a particular storage element is programmed as an SLC, the output value may be determined to be associated with a particular state (e.g., the "Er" state or the "A" state), or to be associated with a particular state and a corresponding reliability value, based on values received from each of the two or more read operations and the threshold voltage values set of each of these read operations. To illustrate, when only two read operations using the same threshold value are applied and produce conflicting (e.g., different) result values, the output value of the particular storage element programmed as an SLC may be determined to be a default output value, such as a default "Er" state output value or a default "A" state output value. Alternatively, the output value may be determined as one of the "Er" state or the "A" state in a random manner, such as when only two read operations using the same threshold value are applied and produce conflicting (e.g., different) result values. To illustrate, when a first read operation of the two read operations is associated with the "A" state (e.g., indicating a conducting memory cell) and a second read operation of the two read operations is associated with the "Er" state (e.g., indicating a non-conducting memory cell), the output value may be randomly selected to be one of the "Er" state or the "A" state. Additionally, when the first and second read operations have different result values, the output value may be determined to have a low reliability value or a zero reliability value.

Thus, two read operations may be performed as part of the multi read operation 162 to generate a reliability value as compared to the soft bit read operation 168 which performs at least three separate read operations.

Although the multi read operation 162 has been described as including two operations, the multi read operation 162 may include more than two read operations. For example, the multi read operation 162 may include three or more different read operations that each use the same reading voltage. If the results based on the three or more read operations have the same value, then an output value of the particular storage element may be determined to have a high reliability value. If the results based on the three or more read operations have different values, a determination may be made where there is a majority, such as a majority of results having the same value. If a majority is identified, the output value may be determined based on the majority and a low reliability value may be assigned to the output value. If no majority is identified, the output value may be selected in a predetermined manner (e.g., as a default value) or in a random manner, and the output value may be assigned a zero reliability value. Additionally, although the multi read operation 162 has been described as being performed on an SLC storage element, the multi read operation 162 may be performed on a MLC storage element.

Because the multi read operation 162 uses the same read voltage for each reading operation, the data storage device 102 does not need to change (e.g., set) one or more read parameters between different read operations of the multi-read operation 162. Thus, when the multi read operation 162 and the soft bit read operation 168 each include a same number of read operations (e.g., three read operations), the multi read operation 162 may take less time to perform than the soft bit read operation 168 because the multi read operation 162 does not have to change one or more parameters between different read operations as compared to the soft bit read operation 168. Additionally, when the multi read operation 162 used two read operations, the multi read operation 162 may take less to perform than the soft bit operation 168 because the number of read pulse operations is reduced (e.g., from three (3) read pulse operations for the soft bit read operation 168 to two (2) read pulse operations for the multi read operation 162 that uses two read operations).

The controller 120 may include a bit comparator 124. The bit comparator 124 may receive a result(s) from one or more read operations, such as the single read operation 160, the multi read operation 162, or the soft bit read operation 168, performed on a storage element. For example, when the single read operation 160 is performed on the storage element, the bit comparator 124 may receive a single result associated with the storage element. As another example, when the multi read operation 162 or the soft bit read operation 168 is performed, the bit comparator 124 may receive multiple results associated with the storage element. Based on the result(s), the bit comparator 124 may determine an output value for the storage element and/or a reliability that is assigned to the output value.

To illustrate, the bit comparator 124 may receive a first result (based on a first read operation of the multi read operation 162) and a second result (based on a second read operation of the multi read operation 162) associated with a storage element. The bit comparator 124 may compare (e.g., perform a comparison) the first result to the second result to determine whether the first result and the second result have the same value. If the first result and the second result have the same value, the bit comparator 124 may determine an output value of the storage element based on the first result (or the second result). To illustrate, the output value may be determined to be equal to the first result.

An illustrative, non-limiting example of the bit comparator 124 receiving results based on the multi read operation 162 is depicted at 180. For example, the multi read operation 162 may be associated with performing a first read operation and a second read operation for each storage element of a page of the memory 104. For example, the page of the memory 104 may include eight storage elements 182, such as a first storage element S1, a second storage element S2, a third storage element S3, fourth through seventh storage elements S4-S7 (not shown), and an eighth storage element S8. The eight storage elements 182 may include or correspond to the storage elements 150. Although the page of the memory 104 is described as having eight storage elements, the page may include less than eight storage elements or more than eight storage elements.

Based on the first read operation, the bit comparator 124 may receive a first set of read values (Data_1) 184 including a first read value for each of the storage elements S1-S8. Based on the second read operation, the bit comparator 124 may receive a second set of read values (Data_2) 186 including a second read value for each of the storage elements S1-S8. Based on the first set of read data 184 and the second set of read data 186, the bit comparator 124 may determine an output value and/or a reliability value for each of the storage elements S1-S8. For example, an illustrative, non-limiting example of output values and reliability values determined by the bit comparator 124 is depicted at 190. Based on the sets of read data 184, 186, the bit comparator 124 may generate a set of output values 194 and a set of reliability values 196. To illustrate, for each storage element, the bit comparator 124 may generate an output value and assign a reliability value to the output value, as described further herein.

For each particular storage element, the bit comparator 124 may compare multiple read results, such as a first read value to a second read value, to determine an output value and a reliability value corresponding to the storage element. For example, referring to the first storage element S1, the bit comparator 124 may determine that the first read value and the second read value have the same value (e.g., a value of 1). Accordingly, the bit comparator 124 may select (e.g., generate) the output value of the first storage element S1 to have a value of 1 and may assign a high reliability value (H) to the output value of the first storage element S1. As another example, referring to the second storage element S2, the first read value (having a first value of 0) and the second read value (having a second value of 1) have different values. Based on the first read value and the second read value having different values, the bit comparator 124 may select (e.g., generate) the output value of the second storage element S2 to have a value of 1, a value of 0, an arbitrary value, a predetermined (e.g., default) value, a value based on the first read operation, or a value based on the second read operation, as illustrative, non-limiting examples. Additionally, based on the first read value and the second read value having different values, the bit comparator 124 may assign a low reliability value (L) to the output value of the second storage element S2. The reliability measure "L" or "H" in the set of reliability values 196 may be represented in one or more bits. In an example using a single bit, the reliability measure "L" may be represented as a bit value of "0" and the reliability measure "H" may be represented as a bit value of "1". The bit comparator 124 may be configured to provide the set of reliability values 196 to a decoder 122.

Although the examples 180, 190 have been described in conjunction with the bit comparator 124 receiving read values based on the multi read operation 162 including two read operations that use the same read voltage, the bit comparator 124 may receive and compare read values associated with the multi read operation 162 that includes more than two read operations using the same read voltage. When the bit comparator 124 compares more than two results for a particular storage element, the bit comparator 124 may determine whether a majority of the results have the same value and may select the output value based on the majority. Additionally or alternatively, when the bit comparator 124 compares more than two results for the particular storage element, the bit comparator 124 may select a reliability value (from more than two available reliability values) to be assigned for the output value of the particular storage element. For example, the more than two available reliability values may include a high reliability value (H), a low reliability value (L), or a zero reliability value, as illustrative, non-limiting examples. In some embodiments, each reliability value generated by the bit comparator 124 may include or correspond to a log-likelihood ratio (LLR). For example, an LLR may be assigned to a particular output value to indicate a likelihood that the particular output value has a "0" value or a "1" value (e.g., the LLR may correspond to the logarithm of a likelihood that the particular output value represents a "0" bit divided by a likelihood that the particular output value represents a "1" bit).

The controller 120 may include the decoder 122 configured to receive read values, output values, reliability values, or a combination thereof, associated with read operations performed on the storage elements 150. For example, the decoder 122 may receive read values based on one or more single read operations, such as the single read operation 160, or may receive read values or output values (and/or reliability values) based on one or more multi read operations or one or more soft bit read operations, such as the multi read operation 162 or the soft bit read operation 168. The decoder 122 may receive the read values (or output values) from the memory die 103 (e.g., the read circuitry 140) or from the bit comparator 124. For example, the decoder 122 may receive the read values (e.g., output values and/or reliability values, such as the output values 194 and the reliability values 196) from the bit comparator 124.

The decoder 122 may include or be associated with an error correction code (ECC) engine (not shown). The ECC engine may be configured to receive data, such as the user data 132, and to generate one or more codewords (e.g., including a data portion and a parity portion) based on the data. For example, the ECC engine may include an encoder configured to encode the data using an ECC encoding technique. The ECC engine may include a Reed-Solomon encoder, a Bose-Chaudhuri-Hocquenghem (BCH) encoder, a low-density parity check (LDPC) encoder, a turbo encoder, a turbo product encoder, an encoder configured to encode the data according to one or more other ECC techniques, or a combination thereof, as illustrative, non-limiting examples.

The decoder 122 may be configured to decode data read from the memory 104 to detect and correct bit errors that may be present in the data. The decoder 122 may perform decoding operations that utilize reliability information, such as log-likelihood ratios (LLRs). For example, the decoder 122 may receive (e.g., from the bit comparator 124) or generate a log-likelihood ratio (LLR) for each received output value and initiate decoding using the LLRs. To illustrate, a particular LLR value may be computed based on a statistical model (e.g., based on a reliability value which is proportional to a magnitude of a majority reading for a particular storage element), as described further with reference to FIG. 2, or retrieved from a pre-computed table of LLR values. As another example, the decoder 122 (e.g., the ECC engine) may correct a number of bit errors up to an error correction capability of a technique (e.g., an ECC technique) implemented by the decoder 122. A number of errors identified by the decoder 122 (e.g., the ECC engine) may be tracked by the controller 120, such as by the ECC engine. For example, based on the number of errors, the ECC engine may determine a bit error rate (BER) associated with one or more blocks of the memory 104.

During operation of the data storage device 102, the controller 120 may receive the user data 132 from the host device 130 to be written to the memory 104. The controller 120 may send the command 172 that includes a write command to the memory die 103. The write command may command the memory 104 to write the user data 132 (or an encoded version of the user data 132) into a particular location in the memory 104, such as a location that may correspond to one or more of the storage elements 150.

After the user data 132 is written to the memory 104, the controller 120 may receive a read command from the host device 130. The controller 120 may send another command 172 that includes a read command associated with a multi read operation 162 to be performed on multiple storage elements. Based on the read command, the read circuitry 140 may perform multiple read operations on the memory 104 and provide multiple read values associated with the multiple storage elements to the bit comparator 124.

For each storage element of the multiple storage elements that are read, the bit comparator 124 may determine an output value and/or a reliability value based on the multiple read values. The output values and/or reliability values determined by the bit comparator 124 may be provided to the decoder 122 (e.g., the ECC engine) to determine the user data 132 read from the memory 104. The user data 132 read from the memory 104 may be provided to the host device 130 by the controller 120.

For example, the read circuitry 140 may perform multiple first read operations (e.g., the multi read operation 162 including two or more read operations) at a first storage element of the storage elements 150. Each read operation of the multiple first read operations may be performed using a same first reading voltage. Based on the multiple first read operations, the bit comparator 124 may receive at least a first read value and a second read value associated with the first storage element. The bit comparator 124 may determine whether each of the read values generated based on the multiple first read operations have the same value. When the bit comparator 124 determines that each of the multiple first read operations did not generate the same read value, the bit comparator 124 may generate a first reliability value based on the read values associated with the multiple first read operations (e.g., based on a majority of read results that have the same value). When the bit comparator 124 determines that each of the multiple first read operations generated the same read value, the soft bit read operation 168 may be performed on the first storage element and the bit comparator 124 may generate the first reliability value (associated with the first storage element) based on read values generated by the soft bit read operation 168.

As another example, the read circuitry 140 may perform multiple second read operations (e.g., the multi read operation 162 including two or more read operations) at a second storage element of the storage elements 150. The first storage element and the second storage element may be associated with a same physical page. Each read operation of the multiple second read operations may be performed using a same second reading voltage. The second reading voltage may be the same voltage or a different voltage than the first reading voltage. Based on the multiple second read operations, the bit comparator 124 may receive multiple read values associated with the second storage element and may determine whether each of the read values generated based on the multiple second read operations have the same value. When the bit comparator 124 determines that each of the multiple second read operations did not generate the same read value (e.g., when at least two of the multiple second read operations generate different read values), the bit comparator 124 may generate a first reliability value based on the read values associated with the multiple second read operations.

In some implementations, the controller 120 may receive a read command from the host device 130 and send the command 172 that includes a read command associated with the single read operation 160. A read value based on the single read operation 160 may be provided to the decoder 122 (e.g., the ECC engine within the decoder 122). If a read error is detected (e.g., determined) by the decoder 122 based on the read value, the controller 120 may send a second command 172 associated with the read pulse operation 164. Execution of the read pulse operation 164 may operate to de-trap electrons trapped in oxide layers of storage elements that cause noise that affects the storage element being read. After the read pulse operation 164 is performed, the controller 120 may send a third command 172 associated with the single read operation 160, the multi read operation 162, the soft bit read operation 168, or a combination thereof.

In some implementations, the controller 120 may receive a read command from the host device 130. The read command received from the host device 130 may be associated with reading a particular storage element of the storage elements 150. In response to the read command from the host device 130, the controller 120 may send the command 172 that includes the read pulse operation 164. The command 172 that includes the read pulse operation 164 may be sent by the controller 120 prior to sending another command 172 that is associated with generating one or more read values for the particular storage element, such as one or more read values generated based on the single read operation 160, the multi read operation 162, or the soft bit read operation 168.

Although the bit comparator 124 and the decoder 122 are illustrated as being included in the controller 120, the bit comparator 124, the decoder 122, and/or functions thereof may be located at locations other than in the controller 120 or performed by a component other than the controller 120. For example, the bit comparator 124 and/or the decoder 122 may be included in the memory die 103 or in the host device 130. As another example, functionality described with respect to the bit comparator 124 and/or the decoder 122 may be performed by one or more components of the memory die 103 and/or one or more components of the host device 130.

By performing the multiple read operations on the storage element, statistical noise may be taken into consideration during a read procedure and/or a decode procedure associated with the storage element. For example, effects of the statistical noise on the stored voltage of the storage element and/or on the reading voltage may be observed (e.g., realized) based on the results of the multiple read operations and may be addressed through use of a reliability value. Additionally, by using the same reading voltage when performing the multiple read operations, a number of the multiple read operations may be performed in a shorter time period than the same number of soft read operations that each use a different reading voltage. Accordingly, by performing the multiple read operations that each use the same reading voltage, statistical noise effects may be overcome (e.g., compensated for) when determining a programmed state of the storage element Referring to FIG. 2, a particular illustrative embodiment of a model associated with reading a storage element to account for statistical noise is depicted and designated 200. The storage element may be included in a memory of a data storage device, such as the memory 104 of the data storage device 102 of FIG. 1. The generalized methodology illustrated by the model 200 may be implemented by the data storage device 102, such as by the controller 120, the decoder 122, the bit comparator 124, the read circuitry 140 of FIG. 1, or a combination thereof, as illustrative, non-limiting examples.

Figure 2:
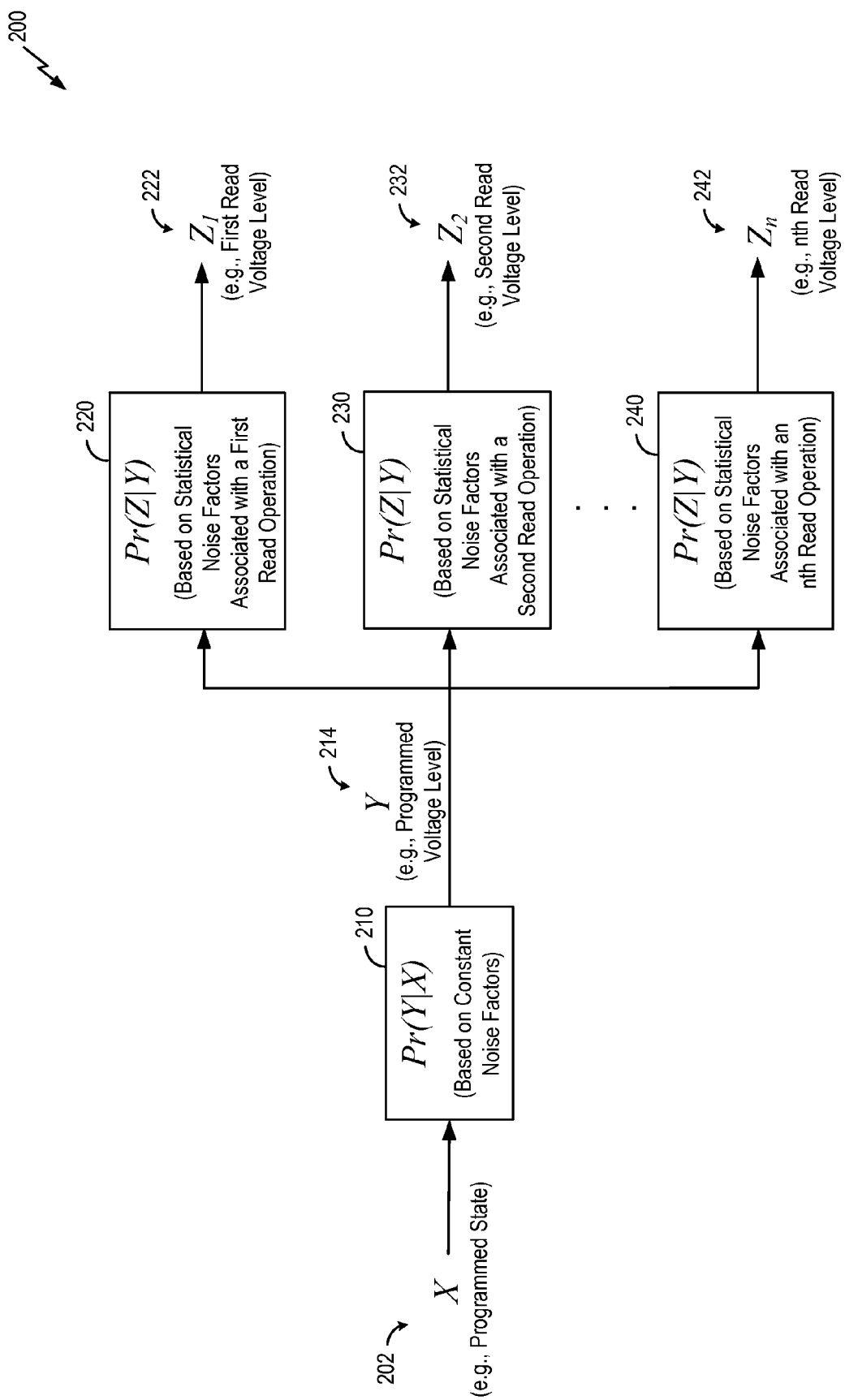
FIG. 2 is a diagram illustrating a model associated with reading a storage element to account for statistical noise.

As illustrated in FIG. 2, the model 200 including the values X–Y–Z may form a Markov chain, such that Pr(X|Y, Z)=Pr(X|Y). Stated another way, a value Z may convey no information on a value X 202 if a value Y 214 is known (e.g., (I(X;Z|Y)=0)). To enable implementation of the model 200 at a data storage device, such as the data storage device 102 of FIG. 1, some assumptions may be made about the values X, Y, and Z and/or about the probabilities Pr(Y|X) and Pr(Z|Y), as described further herein.

The value X 202 represents a desired voltage (e.g., a programmed state) that the storage element is to be programmed. For example, the programmed state may be associated with one of a first programmed state (P1), such as an erase state (ER), or a second programmed state (P2), such as a state A. However, based on one or more different noise factors (e.g., noise factors that remain relatively constant from one read operation to another read operation), an actual voltage of the storage element is represented by the value Y 214. Although the storage element may be described as being programmed to one of two programmable states, in other embodiments the storage element may be programmed to one of three or more programmable states.

The one or more different noise factors may include or correspond to phenomena such as a basic voltage level distribution, program disturb (PD), cross coupling, back pattern (BP) (e.g., based on different bit lines having different resistances), etc. It may be assumed that the one or more different noise factors are known (e.g., effects of the different noise factors is known) and are associated with a probability Pr(Y|X) 210 that the storage element programmed to the value X 202 may arrive at the value Y 214.

The value Y 214 (e.g., the actual programmed voltage level of the storage element) may be equal to a read voltage level of the storage element assuming that cell noise, such as statistical noise, does not affect the read voltage level (e.g., assuming identical charge trapping realization during programming and read). However, when statistical noise is present during a read operation of the storage element, the "actual" read voltage level (represented as a value Z) may not be equal to the value Y 214. Because of the random nature of statistical noises, the voltage level read from the storage element may be different with each read operation. For example, a first read operation of the storage element may result in a first value $Z_1$ 222, a second read operation of the storage element may result in a second value $Z_2$ 232, and an $n^{th}$ read operation (where n is a positive integer) may result in an $n^{th}$ value $Z_n$ 242. It may be assumed that the statistical noises are unknown (e.g., effects of the statistical noises is unknown) and change with each read operation. The effects of statistical noises may be associated with a probability Pr(Z|Y) that the storage element programmed with the value Y 214 may be read as the value Z. To illustrate, a first probability Pr(Z|Y) 220 may be associated with the first read operation, a second probability Pr(Z|Y) 230 may be associated with the second read operation, and an $n^{th}$ probability Pr(Z|Y) 240 may be associated with the $n^{th}$ read operation (e.g., where n is a positive integer). Although three read operations are illustrated in the model 200, less than three read operations or more than three read operations may be performed.

The probability Pr(Y|X) 210 may be assumed to be identical for all of the storage elements (e.g., for all cells) and may be known. The probability Pr(Y|X) 210 may be estimated by gathering statistics about the memory, such as the memory 104 of FIG. 1, that includes the storage elements. For example, the probability Pr(Y|X) 210 may be an expected transition probability from the value X 202 to the value Y 214, which may be averaged over all of the storage elements included in a memory. For example, if data associated with statistics (of transitions from the value X 202 to the value Y 214 for different storage elements) are gathered with a resolution of m read voltage levels (where m is an integer greater than 1), then the probability Pr(Y|X) 210 may be represented in a $2^k \times m$ table containing transition probabilities from the value X 202 to the value Y 214 for different storage elements, where k is a number of bits per storage element (e.g., bits per cell). The data associated with the statistics may be gathered during fabrication of the memory.

It may be assumed that the probability Pr(Z|Y), such as each of the probabilities Pr(Z|Y) 220, 230, 240, is not known (e.g., even if the value Y 214 is given) and that the Pr(Z|Y) is different for each storage element. Parameters associated with the probability Pr(Z|Y) may be estimated separately for each storage element based on a set of read voltage levels, such as the read voltage levels having the values $Z_1, Z_2, \ldots, Z_n$. It may also be assumed that a noise realization between multiple read operations is statistically independent and identically distributed according to the probability Pr(Z|Y) (e.g., assume that a de-correlation operation is performed between each read operation). Each of the multiple read operations may be performed using the same read threshold (e.g., the same read voltage). Parameters of this distribution may be estimated separately for each storage element based on a set of read voltage levels, such as the values $Z_1, Z_2, \ldots, Z_n$. In this manner, the set of read voltage levels (e.g., the values $Z_1, Z_2, \ldots, Z_n$) may provide an ergodic sequence of observations of the value Y 214.

Using the model 200, a state of the storage element may be determined based on multiple read operations, as described further herein. For example, the multiple read operations may produce the values $Z_1, Z_2, \ldots, Z_n$. If the storage element may be programmed in one of two different states, a majority value of the values $Z_1, Z_2, \ldots, Z_n$ may be used to determine the state of the storage element. It is assumed that each read operation does not affect a result of other read operations (e.g., each read voltage level is independent of the other read voltage levels) and that a probability of the value Y 214 given the value Z may be estimated based on the read voltage level (e.g., the values $Z_1$, $Z_2, \ldots, Z_n$).

To illustrate, cell noise (e.g., statistical noise) associated with the storage element may be assumed to be caused by a single trap site (e.g., one or more electrons trapped in an oxide layer of the storage element). Based on the cell noise, the storage element may exhibit a bimodal behavior (e.g., the storage element may be in one out of two states). In this case, the cell noise may be modeled by:

$$Z = Y + V_{cn},$$

where $V_{cn}$ represents a voltage shift due to cell noise. For example, $V_{cn}$ may be distributed according to:

$$V_{cn} = \begin{cases} 0 & \text{with probability } \alpha \\ \Delta & \text{with probability } 1 - \alpha \end{cases}$$

The parameters $\Delta$ and $\alpha$ of the cell noise distribution may be unknown parameters. However, an estimation of $\alpha$, denoted as $\hat{\alpha}$ may be obtained based on the values $Z_1, Z_2, \ldots, Z_n$. For example, it may be assumed that among 'n' readings (where 'n' is a positive integer) of the storage element, a value $Z_A$ is read n' times and read a value $Z_B$ is read n-n' times. Then, $$\hat{\alpha} = \frac{n'}{n},$$

where $Z_A = Y$ and $Z_B = Y + \Delta$. In a memory storage device, such as flash memory device (e.g., NAND storage), a read noise distribution is usually known or can be characterized during production of the memory storage device. Therefore, parameters of the model 200 may be known and more accurate log-likelihood ratio (LLR) values may be provided as a function of how many read operations occur. Since noise may vary between different memory realizations (e.g., different NAND word-lines or NAND blocks) a method that utilizes the model 200 may start with a single read (or two reads) and then continue doing more and more read operations to improve the LLR values fed to a decoder, such as the decoder 122 of FIG. 1, until convergence is achieved. This means that after each read operation, an input to the decoder is re-calibrated and another decoding operation is performed (e.g., attempted). When the decoder does not converge on a valid code word, a next read operation is initiated. In the event of a successful convergence to a valid code word, additional read operations are not performed. This process saves time by initiating a decoder early, such as after one or two read operations, rather than first performing a large number (e.g., three or more) of read operations and then starting a decoding operation.

To calculate the a-priori log-likelihood ratio (LLR) bit estimates, a probability $Pr(Y|Z_1, Z_2, \ldots, Z_n)$ may be determined. For example, the probability $Pr(Y|Z_1, Z_2, \ldots, Z_n)$ may be determined according to:

$$Pr(Y = y | Z_1, Z_2, \ldots, Z_n) = \begin{cases} \hat{\alpha} & \text{if } y = Z_A \\ 1 - \hat{\alpha} & \text{if } y = Z_B \\ 0 & \text{Otherwise} \end{cases}$$

A-priori LLR bit estimates for the $i^{th}$ bit in the cell may be given by:

$$LLR = \log\left[\frac{Pr(b_i = 0 | Z_1, Z_2, \ldots, Z_n)}{Pr(b_i = 1 | Z_1, Z_2, \ldots, Z_n)}\right] = \ldots \quad (1.1)$$

$$\ldots = \log\left[\frac{\sum_{X \in X_i^0} Pr(X | Z_1, Z_2, \ldots, Z_n)}{\sum_{X \in X_i^1} Pr(X | Z_1, Z_2, \ldots, Z_n)}\right] = \ldots$$

where $X_i^0 = \{X | \exists \underline{b} \in \underline{b}_i^0, \text{ such that } f(\underline{b}) = X\}$, $X_i^1 = \{X | \exists \underline{b} \in \underline{b}_i^1, \text{ such that } f(\underline{b}) = X\}$ and $\underline{b}_i^0, \underline{b}_i^1$ denote the sets of length 2 binary sequences with the $i^{th}$ bit equal to 0 and 1, respectively. $X_i^0$ means that it is the states for which bit-i is zero.

To further explain equation (1.1) and the definition of $X_i^0$, an example is provided where: $f: 2^2 \rightarrow [1, 2, 3, 4]$ (using above terms m=4, k=2) denote the mapping function $f(\underline{b})$, matching each length 2 binary sequences b to a programmed cell state X out of the 4 possible states of the cell. The $f(\underline{b})$ is the memory mapping function (e.g., a NAND mapping function) that takes the 2 bits b and map it into one of 4 states. In this example (m=4, k=2) the mapping function $f(\underline{b})$ is: '11' state "Er", '10'→state "A", '00'→state "B", '01'→state "C". The first bit (e.g., a most significant bit) may be the lower page bit and the second bit (e.g., a least significant bit) may be upper page bit. Here $i \in \{0,1\}$ and $X_i^0$ represent the states for which the second bit is '0' or states "A" and "B".

Referring back to equation (1.1), equation (1.1) may be developed using the following equation (1.2):

$$Pr(X | Z_1, Z_2, \ldots, Z_n) = \sum_Y Pr(X, Y | Z_1, Z_2, \ldots, Z_n) =$$

$$\sum_Y Pr(X | Y, Z_1, Z_2, \ldots, Z_n) \cdot Pr(Y | Z_1, Z_2, \ldots, Z_n) = \underset{X-Y-Z \text{ is a markov chain}}{=}$$

$$\sum_Y Pr(X | Y) \cdot Pr(Y | Z_1, Z_2, \ldots, Z_n) ==$$

$$\sum_Y \frac{Pr(Y | X) \cdot Pr(X)}{Pr(Y)} \cdot Pr(Y | Z_1, Z_2, \ldots, Z_n)$$

Plugging equation (1.2) into equation (1.1) and assuming $$Pr(X) = \frac{1}{m}$$

for any state X (e.g., when scrambling is used) we continue as follows:

$$LLR = \log\left[\frac{\sum_{X \in X_i^0} Pr(X | Z_1, Z_2, \ldots, Z_n)}{\sum_{X \in X_i^1} Pr(X | Z_1, Z_2, \ldots, Z_n)}\right] = \ldots$$

$$\ldots = \log\left[\frac{\sum_{X \in X_i^0} \sum_Y \frac{Pr(Y | X) \cdot \frac{1}{m}}{Pr(Y)} \cdot Pr(Y | Z_1, Z_2, \ldots, Z_n)}{\sum_{X \in X_i^1} \sum_Y \frac{Pr(Y | X) \cdot \frac{1}{m}}{Pr(Y)} \cdot Pr(Y | Z_1, Z_2, \ldots, Z_n)}\right]$$

The order of summation between 'X' and 'Y' may be changed and the $\frac{1}{m}$ element may be reduced to produce:

$$\ldots = \log\left[\frac{\sum_Y\left\{\sum_{X\in X_i^0}\frac{Pr(Y\mid X)}{Pr(Y)}\cdot Pr(Y\mid Z_1,Z_2,\ldots,Z_n)\right\}}{\sum_Y\left\{\sum_{X\in X_i^1}\frac{Pr(Y\mid X)}{Pr(Y)}\cdot Pr(Y\mid Z_1,Z_2,\ldots,Z_n)\right\}}\right] \quad (1.5)$$

$$= \ldots$$

Base law $Pr(Y)=E_x\ Pr(Y|X)\cdot Pr(x)$ may be used and plugged into equation (1.5) to get:

$$LLR = \log\left[\frac{\sum_Y\left\{\sum_{X\in X_i^0}\frac{Pr(Y\mid X)}{\sum_X Pr(Y\mid X)\cdot Pr(x)}\cdot Pr(Y\mid Z_1,Z_2,\ldots,Z_n)\right\}}{\sum_Y\left\{\sum_{X\in X_i^1}\frac{Pr(Y\mid X)}{\sum_X Pr(Y\mid X)\cdot Pr(x)}\cdot Pr(Y\mid Z_1,Z_2,\ldots,Z_n)\right\}}\right] = \ldots \quad (1.6)$$

Again, assuming uniform $$Pr(X)=\frac{1}{m}$$

in equation (1.6) and reducing the numerator and the denominator, equation (1.6) may be simplified to get:

$$LLR = \log\left[\frac{\sum_Y\left\{\sum_{X\in X_i^0}\frac{Pr(Y\mid X)}{\sum_X Pr(Y\mid X)}\cdot Pr(Y\mid Z_1,Z_2,\ldots,Z_n)\right\}}{\sum_Y\left\{\sum_{X\in X_i^1}\frac{Pr(Y\mid X)}{\sum_X Pr(Y\mid X)}\cdot Pr(Y\mid Z_1,Z_2,\ldots,Z_n)\right\}}\right]$$

Since $\Sigma_x\ Pr(Y|X)$ do not depend on value of 'X', the summation over X may be moved to the numerator, such that the expression for LLR is:

$$LLR = \log\left[\frac{\sum_Y\left\{\frac{\sum_{X\in X_i^0} Pr(Y\mid X)}{\sum_X Pr(Y\mid X)}\cdot Pr(Y\mid Z_1,Z_2,\ldots,Z_n)\right\}}{\sum_Y\left\{\frac{\sum_{X\in X_i^1} Pr(Y\mid X)}{\sum_X Pr(Y\mid X)}\cdot Pr(Y\mid Z_1,Z_2,\ldots,Z_n)\right\}}\right] \quad (1.7)$$

To determine a LLR value using expression (1.7), values of $Pr(Y|X)$ and $Pr(Y|Z_1,Z_2,\ldots,Z_n)$ may be determined and used. As described earlier, $Pr(Y|X)$ may be given as a pre-computed table estimated based on memory statistics (e.g., flash memory statistics) and $Pr(Y|Z_1,Z_2,\ldots,Z_n)$ may be computed separately for each cell. For cells with a single trap site, where cell noise can take only two values, the sum over Y in (1.7) contains only two terms: $Y=Z_A$ and $Y=Z_B$, since $Pr(Y|Z_1,Z_2,\ldots,Z_n)=0$ if $Y\neq Z_A, Z_B$.

To illustrate equation (1.7), a numerical example is provided. In the numerical example, the following assumptions 1-4 are presented:

1. We use the case of SLC→k=1, m=2;
2. There are 4 reads ($Z_1$ to $Z_4$) out of which 3 values are read as $Z_A$ and 1 value is read as $Z_B$, then $\hat{\alpha}=0.75$;
3. The read circuitry has high resolution, meaning we identify $Z_A$ and $Z_B$ voltages; and
4. 'Y' as function of 'X' has a Gaussian distribution with parameters $\mu=0$, $\sigma=\sqrt{0.5}$, program state median is at $v_p$ and erase state median is at $v_e$.

Using assumptions 1-3 in equation (1.7) yields items 5-8:

5. For $Y=Z_A$ and $x=0$: $Pr(Y|X)\cdot Pr(Y|Z_1,Z_2,Z_3)=e^{-|Z_A-V_p|^2}\cdot 0.75$
6. For $Y=Z_A$ and $x=1$: $Pr(Y|X)\cdot Pr(Y|Z_1,Z_2,Z_3)=e^{-|Z_A-V_e|^2}\cdot 0.75$
7. For $Y=Z_B$ and $x=0$: $Pr(Y|X)\cdot Pr(Y|Z_1,Z_2,Z_3)=e^{-|Z_B-V_p|^2}\cdot 0.25$
8. For $Y=Z_B$ and $x=1$: $Pr(Y|X)\cdot Pr(Y|Z_1,Z_2,Z_3)=e^{-|Z_B-V_e|^2}\cdot 0.25$ The items 5-8 may be applied to equation (1.1) to produce:

$$LLR = \log\left[\frac{\frac{e^{-|Z_A-V_p|^2}\cdot 0.75}{e^{-|Z_A-V_p|^2}+e^{-|Z_A-V_e|^2}} + \frac{e^{-|Z_B-V_p|^2}\cdot 0.25}{e^{-|Z_B-V_p|^2}+e^{-|Z_B-V_e|^2}}}{\frac{e^{-|Z_A-V_e|^2}\cdot 0.75}{e^{-|Z_A-V_p|^2}+e^{-|Z_A-V_e|^2}} + \frac{e^{-|Z_B-V_e|^2}\cdot 0.25}{e^{-|Z_B-V_p|^2}+e^{-|Z_B-V_e|^2}}}\right]$$

The result of applying values 5-8 to equation (1.1) may be complex to compute but it can be done offline by providing the inputs to a computation engine. Additionally, assumption number (3) above may not always be true; which means that if only a hard bit location is read, several options for '1' and '0' may be determined and $Z_A$ and $Z_B$ may not be determined. This means $\hat{\alpha}$ may be computed but $Pr(Y|X)$ is the same (if a Gaussian distribution of the "Er" state is the same as a Gaussian distribution of a 'Prog' state, such as the "A" state, assuming appropriate thresholds are set). Since the threshold voltage may be unknown, then 'Y' may span over all voltages up to the threshold $V_1$. This means that equation (1.7) may be presented:

$$LLR = \log\left[\frac{\frac{[1-Q(V1)]\cdot 0.75}{1-Q(V1)+Q(V1)} + \frac{Q(V1)\cdot 0.25}{1-Q(V1)+Q(V1)}}{\frac{Q(V1)\cdot 0.75}{1-Q(V1)+Q(V1)} + \frac{[1-Q(V1)]\cdot 0.25}{1-Q(V1)+Q(V1)}}\right] \quad (1.8)$$

$$= \ldots$$

$$\ldots = \log\left[\frac{[1-Q(V1)]\cdot 0.75 + Q(V1)\cdot 0.25}{Q(V1)\cdot 0.75 + [1-Q(V1)]\cdot 0.25}\right] = \ldots$$

$$\ldots = \log\left[\frac{0.75 - 0.5\cdot Q(V1)}{0.25 + Q(V1)\cdot 0.5}\right]$$

If, for example, the fixed programming or D/R noise is set such that Q(V1)=0.5%, then the LLR (binary base) value here is ~1.6 which means it is still '0' but relatively low. To compare with a model of just the fixed noise case (without the bimodal) assuming '0' was read, the LLR value would be:

$$LLR = \log\left[\frac{Pr(0)}{1-Pr(0)}\right] = \log\left[\frac{0.995}{0.005}\right] \sim 7.6$$

As presented, the binomial noise may have quite a substantial impact on the reliability. If, for example, 20 reads are performed (instead of 4 reads) and only 1 out of the 20 reads results in a '1' while all the other 19 cases would result in a '0', then using equation (1.8) with $\hat{\alpha}=0.95$ provides:

$$\log\left[\frac{0.95 - 0.9 \cdot Q(V1)}{0.05 + Q(V1) \cdot 0.9}\right] \approx 4.1.$$

Thus, based on multiple read operations performed on the storage element, a determination may be made regarding how many results (based on the multiple read operations) are in one state and how many results are in the other. A read value of the storage element may be decided based on a majority value of the results of the multiple read operations and a reliability value may be assigned to the read value. For example, if the multiple read operations include three (3) read operations that all end up in the same results, a high reliability value may be assigned. As another example, if the multiple read operations manifest in two (2) results having a first value and (1) value shows a different second result, the read value of the storage element may be selected as the first value (e.g., the majority value) and a low reliability value may be assigned based on the split of the results. Accordingly, the model 200 illustrates a generalized manner in which multiple reads performed on the storage element of the memory 104 may be used to determine a read value and a corresponding reliability value. An example of using the multiple read values from which a corresponding reliability value may be generated is presented above with reference to equation (1.4).

Based on FIG. 2, a generalized manner in which the multi read operation 162 and the soft bit read operation 168 of FIG. 1 are used in combination may include optionally applying a decoupling Vread pulse (e.g., performing the read pulse operation 164 of FIG. 1) on all word-lines (WLs) before performing a reading operation. Storage elements with high read noise may be identified using the multi read operation 162, such as storage elements that produce different read values per read attempt of the multi read operation 162. A bit value for storage elements that produce different read values may be determined according to a majority, thus reducing a failed bit count (FBC) rate. Additionally, a reliability value may be applied (e.g., assigned) that potentially includes a high LLR value according to a value of $\hat{\alpha}$ as explained above. For storage elements that do not produce different read values, a corresponding LLR value may be derived according to the soft bit read operation 168 performed on those storage elements. The LLR values for the storage elements that produced different read values and the LLR values of the storage elements that did not produce different read values may be combined into an LLR sequence used by the decoder 122 (e.g., the ECC engine).

In some embodiments, multiple read operations, each at the same read voltage, may be combined with a soft bit read operation. For example, the soft bit read operation may include performing multiple soft bit reads, each at a different read voltage on a particular storage element. To illustrate, the multiple soft bit reads may use three different read voltages (e.g., a zero offset, $-\Delta$ offset, and $+\Delta$). Each of the multiple soft bit reads may be repeated 'n' times (where 'n' is a positive integer greater than one). Accordingly, for each read value (e.g., the zero offset, the $-\Delta$ offset, and the $+\Delta$), 'n' samples may be generated. To determine an LLR based on a soft bit read operation that performs multiple reads at each read value (e.g., the zero offset, the $-\Delta$ offset, and the $+\Delta$), a majority value may be determined of 3 sets independently. The 3 sets may include a first set of read results that correspond to multiple reads associated with the zero offset, a second set of read results that correspond to the multiple reads associated with the $-\Delta$ offset, and a third set of read results that correspond to multiple reads associated with the $+\Delta$ offset. The majority of the first set of read results (e.g., the zero offset set) may be used as the read value and a reliability value (e.g., the LLR) may be determined based on the second set of read results (e.g., the $-\Delta$ offset) and the third set of read results (e.g., the $+\Delta$ offset). For example, reliability value (e.g., a soft bit value) may be determined as XNOR of the majority of the second set of read results (e.g., the $-\Delta$ offset) and the majority of and the third set of read results (e.g., the $+\Delta$ offset). In this case each voltage bin is treated as a voltage value and the read noise moves the data from one of the bins to one other bin. A determination with respect to the voltage bin is set according to each of the soft value set (e.g., determine the voltage using one set of reads (zero offset, $-\Delta$ offset, and $+\Delta$) and that is repeated 3 times to get repeated readings).

Figure 3:
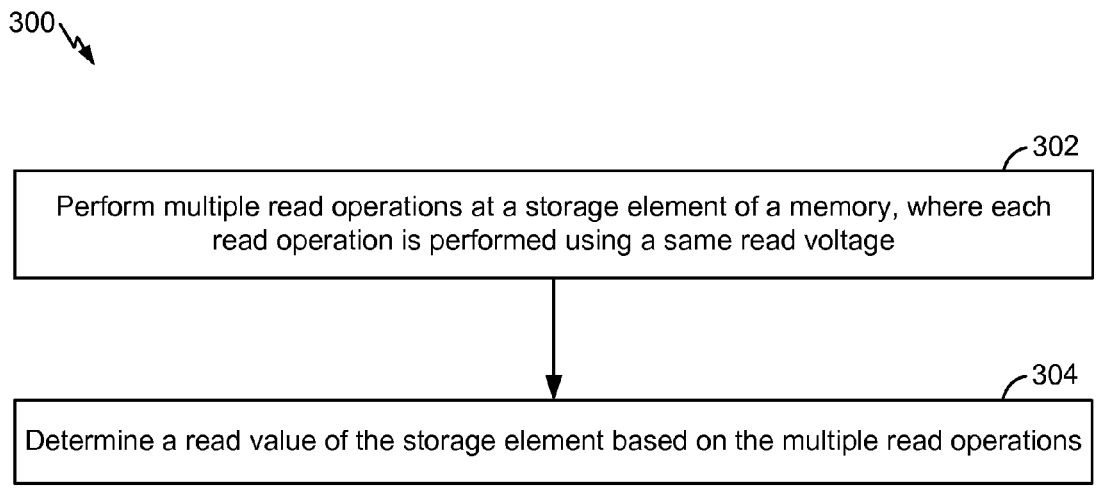
FIG. 3 is a flow diagram of a first illustrative method of reading a storage element.

Referring to FIG. 3, a first illustrative embodiment of a method 300 of reading a storage element is shown. For example, the method 300 may be performed by a controller and/or a memory of the data storage device. To illustrate, method 300 may be performed by the controller 120 and/or the memory 104 (e.g., at the read circuitry 140) of FIG. 1. The data storage device may include or correspond to the data storage device 102 of FIG. 1.

The method 300 includes performing multiple read operations at a storage element of the non-volatile memory, where each read operation of the multiple read operations is performed using a same reading voltage, at 302. The storage element may be included in a memory of the data storage device, such as the memory 104 of FIG. 1. The multiple read operations may include or correspond to the multi read operation 162 of FIG. 1.

The method 300 also includes determining a read value of the storage element based on the multiple read operations, at 304. The read value may be determined by a bit comparator and/or a decoder, as illustrative, non-limiting examples. The bit comparator and the decoder may include or correspond to the bit comparator 124 and the decoder 122 of FIG. 1, respectively.

In a particular embodiment, a voltage pulse may be applied on one or more word-lines, such as one or more word-lines of the same block, prior to performing the multiple read operations. The voltage pulse may include or correspond to the read pulse operation 164 of FIG. 1. The one or more word-lines may include the storage element. For example, the storage element may be included in a particular word-line of the one or more word-lines. The voltage pulse may have a higher voltage than a voltage used during the multiple read operations.

In another particular embodiment, a reliability value may be determined corresponding to the read value. For example, a bit comparator may determine the reliability value based on the multiple read operations. The bit comparator may provide the read value and the reliability value to the decoder.

To determine the reliability value, a first number of results (based on the multiple read operations) having a first value and a second number of results (based on the multiple read operations) may be determined. A determination may be made whether the first number of results or the second number of results constitutes a majority of a total number of results of the multiple read operations. The reliability value may be determined based on the majority. For example, when the first number of results is greater than the second number of results, the reliability value may be determined as (e.g., assigned to) the read value based on a ratio of the first number of results and the total number of results of the multiple read operations. When the first number of results and the second number of results are equal (e.g., there is no majority), one or more additional read operations (using the same reading voltage that was used for the multiple read operations) may be applied to the storage element. Additional results based on the one or more additional read operations may be used to identify whether the majority corresponds to the first value or to the second value. Accordingly, the reliability value may be determined based on the results of the multiple read operations, the additional results of the one or more additional read operations, or a combination thereof. An example of reliability value set according to the results of the multiple read operations is depicted in the above equation (1.8).

By performing the multiple read operations on the storage element, effects of the statistical noise on a stored voltage of the storage element and/or on a reading voltage may be observed (e.g., realized). Accordingly, an output value associated with a storage element and/or a reliability value may be generated that each takes into account the effects of the statistical noise.

Figure 4:
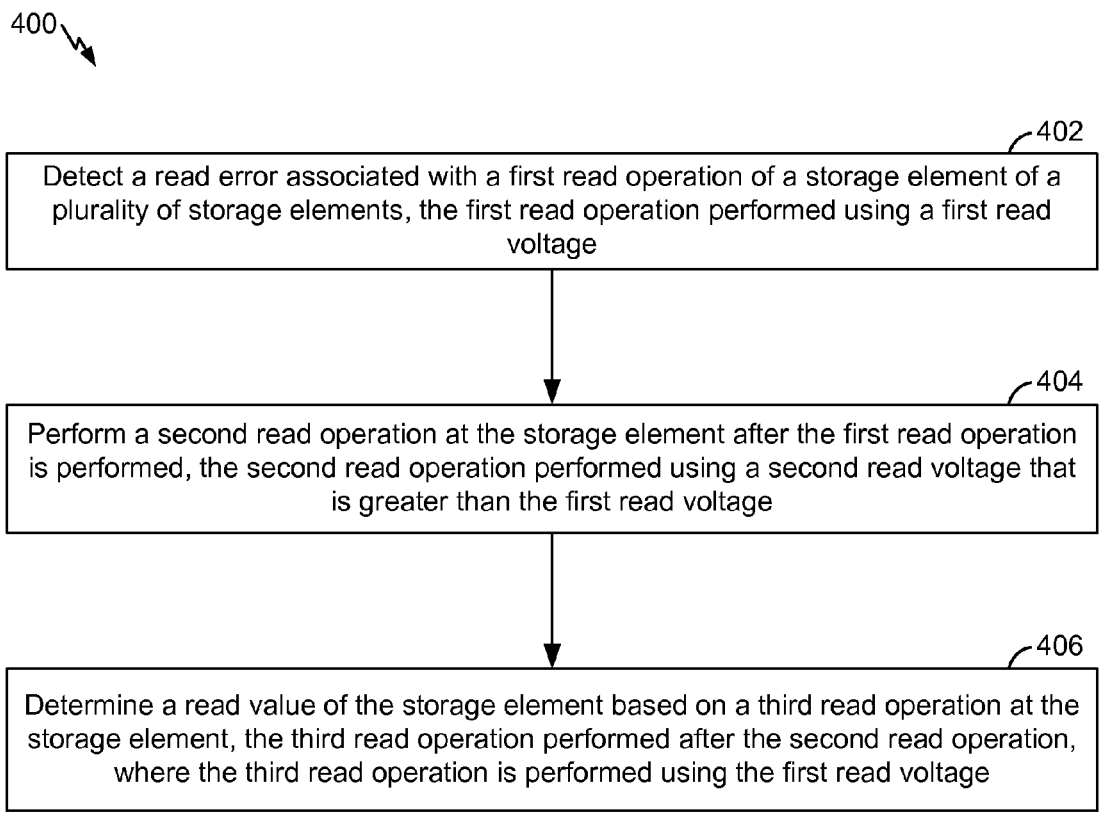
FIG. 4 is a flow diagram of a second illustrative method of reading a storage element.

Referring to FIG. 4, another illustrative embodiment of a method 400 of reading a storage element is shown. For example, the method 400 may be performed by a controller and/or a memory of the data storage device. To illustrate, the method 400 may be performed by the controller 120 and/or the memory 104 (e.g., at the read circuitry 140) of FIG. 1. The data storage device may include or correspond to the data storage device 102 of FIG. 1.

The method 400 includes detecting a read error associated with a first read operation at a storage element of the plurality of storage elements, where the first read operation is performed using a first read voltage, at 402. The plurality of storage elements may be included in a memory of the data storage device, such as the memory 104 of FIG. 1. The first read error may be detected by a decoder, such as the decoder 122 of FIG. 1. The first read operation may include or correspond to the single read operation 160, the multi read operation 162, or the soft read operation 168 of FIG. 1.

The method 400 also includes performing a second read operation at the storage element after the first read operation is performed, where the second read operation is performed using a second read voltage that is greater than the first read voltage, at 404. The second read operation may be performed in response to a read error being detected. The second read operation may be configured to promote release of one or more electrons trapped in an oxide layer associated with the storage element. For example, the second read operation may include or correspond to the read pulse operation 164 of FIG. 1.

The method 400 further includes determining a read value of the storage element based on a third read operation at the storage element, the third read operation performed after the second read operation, where the third read operation is performed using the first read voltage, at 406. For example, the third read operation may include or correspond to the single read operation 160, the multi read operation 162, or the soft read operation 168 of FIG. 1. The third read operation may be a subsequent read operation, such as a next subsequent operation, performed on the storage element after the second read operation.

In a particular embodiment, the storage element is included in a word-line (e.g., included in a physical page).

Based on the detected read error associated with the first read operation, read operations using the second read voltage, such as the second read operation, may be performed on multiple word-lines associated with the word-line. For example, the read operations using the second read voltage may be performed on a word-line or a string that includes the storage element, one or more word-lines or strings adjacent to the word-line or the string that includes the storage element, a block that includes the storage element, etc., as illustrative, non-limiting examples. After the read operations using the second read voltage, the third read operation may be performed.

By performing the second read operation (e.g., the read pulse operation 164 of FIG. 1) electrons trapped in oxide layers of storage elements may be released (de-trapped). Releasing the electrons may reduce an amount of noise experienced by a particular storage element during a read operation performed after the second read operation (e.g., the read pulse operation 164) and may improve a probability of the particular storage element being read without an error.

Figure 5:
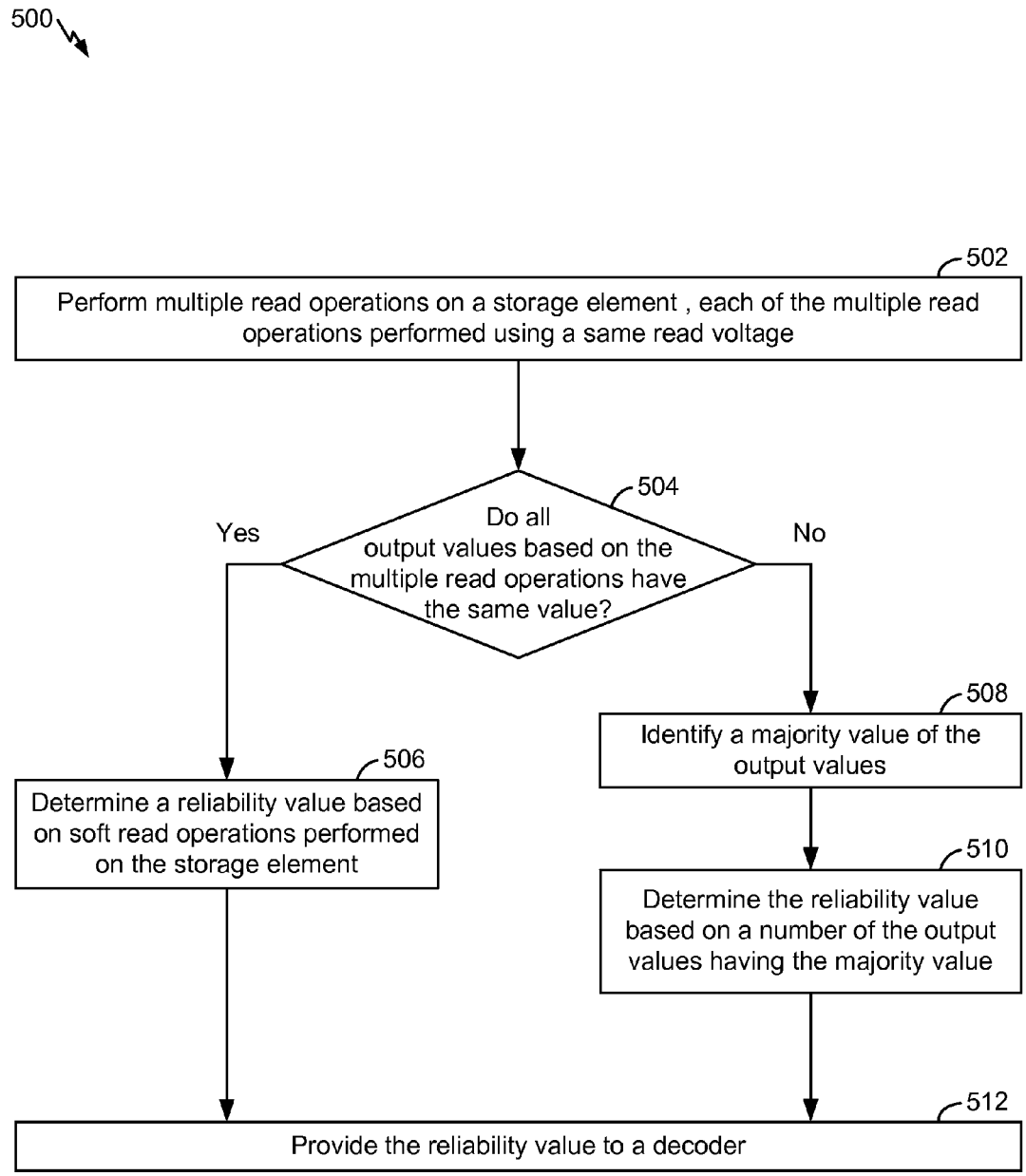
FIG. 5 is a flow diagram of a third illustrative method of reading a storage element.

Referring to FIG. 5, another illustrative embodiment of a method 500 of reading a storage element is shown. For example, the method 500 may be performed by a controller and/or a memory of the data storage device. To illustrate, the method 500 may be performed by the controller 120 and/or the memory 104 (e.g., at the read circuitry 140) of FIG. 1. The data storage device may include or correspond to the data storage device 102 of FIG. 1.

The method 500 may include performing multiple read operations on a storage element, each of the multiple read operations performed using a same read voltage, at 502. The storage element may be included in a memory of the data storage device, such as the memory 104 of FIG. 1. For example, The method 500 may also include determining whether all output values generated based on the multiple read operations have the same value, at 504. A bit comparator, such as the bit comparator 124 of FIG. 1, may determine whether all of the output values have the same value.

When a determination is made that all of the output values have the same value, the method 500 may determine a reliability value based on soft read operations performed on the storage element, at 504. The soft read operations may include or correspond to the soft read operation(s) 168 of FIG. 1. After determining the reliability value based on the soft read operations, the method 500 may advance to 512.

When a determination is made that all of the output values do not have the same value, the method 500 may identify a majority value of the output values, at 508, and may determine the reliability value based on a number of the output values having the majority value, at 510. After determining the reliability value based on the number of the output values having the majority value, the method 500 may advance to 512. The method 500 may include providing the reliability value to a decoder, at 512. For example, the decoder may include or correspond to the decoder 122 of FIG. 1.

In some embodiments, a voltage pulse may be applied on one or more word-lines prior to performing the multiple read operations. The voltage pulse may include or correspond to the read pulse operation 164 of FIG. 1. The one or more word-lines may include the storage element. For example, the storage element may be included in a particular word-line (e.g., a physical page of the particular word-line) of the one or more word-lines. The voltage pulse may have a higher voltage than a voltage used during (e.g., used for each of) the multiple read operations.

In other embodiments, if the majority value of the output values is not able to be determined (e.g., there is no majority), one or more additional read operations using the same reading voltage may be performed to generate more read results and to enable the majority value to be identified. Accordingly, the reliability value may be determined based on the results of the multiple read operations, additional results of the one or more additional read operations, or a combination thereof.

By performing the multi read operation, storage elements may be identified that provide non-reliable results, such as results that have different values. For storage elements that do not provide reliable results, an output value of the cell may be determined according to a majority of the results and a reliability value may be estimated (e.g., estimated according to the estimation of a described with reference to FIG. 2).

Figure 6:
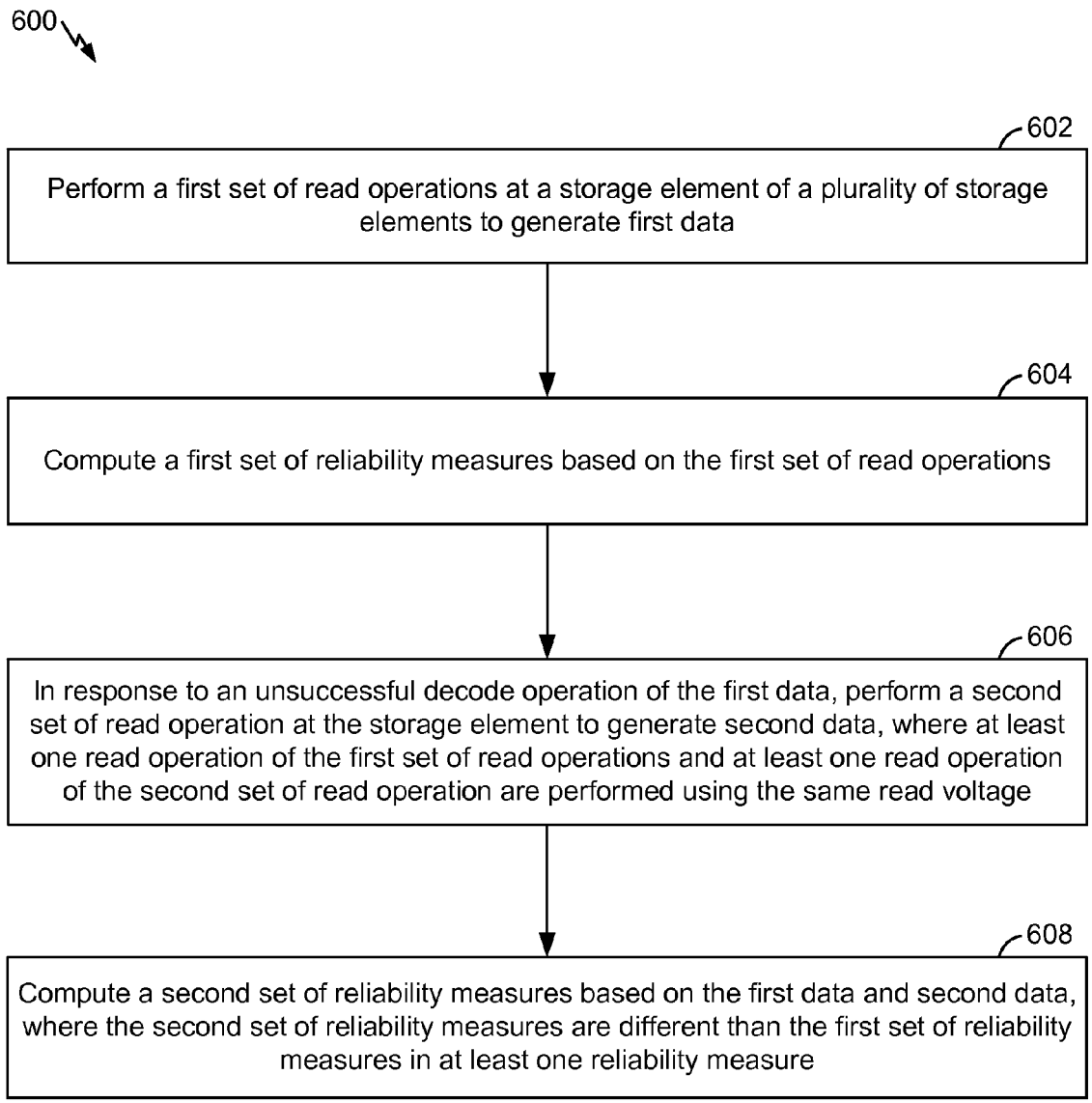
FIG. 6 is a flow diagram of a fourth illustrative method of reading a storage element.

Referring to FIG. 6, another illustrative embodiment of a method 600 of reading a storage element is shown. For example, the method 600 may be performed by a controller and/or a memory of the data storage device. To illustrate, the method 600 may be performed by the controller 120 and/or the memory 104 (e.g., at the read circuitry 140) of FIG. 1. The data storage device may include or correspond to the data storage device 102 of FIG. 1. The memory be a non-volatile memory and may include a plurality of storage elements.

The method 600 may include performing a first set of read operations at a storage element of the plurality of storage elements to generate first data, at 602. The storage element may be included in the memory of the data storage device, such as the memory 104 of FIG. 1. The first set of read operations may include one or more read operations. Prior to performing the first set of read operations, information data may be encoded into an error correction code (ECC) codeword and at least a portion of the ECC codeword may be stored at the storage element. The first data (based on the first set of read operations) may be associated with (e.g., correspond to) a representation of the ECC codeword. In some embodiments, the first data may be generated at the memory of the data storage device and transferred (e.g., communicated) to the controller of the data storage device.

The method 600 may also include computing a first set of reliability measures based on the first set of read operations, at 604. A bit comparator, such as the bit comparator 124 of FIG. 1, may determine whether all of the output values have the same value. The first set of reliability measures may be provided to an ECC decoder, such as decoder 122 of FIG. 1. The ECC decoder may be activated to attempt to reconstruct an ECC codeword based at least in part on the first data, the first set of reliability measures, or a combination thereof. If the ECC decoder is successful in reconstructing the ECC codeword (e.g., the ECC decoder is able to converge on a valid codeword), the ECC decoder may output at least a portion of the ECC codeword, such as a data portion of the ECC codeword.

The method 600 may include, in response to an unsuccessful decode operation of the first data, performing a second set of read operations at the storage element to generate second data, where at least one read operation of the first set of read operations and at least one read operation of the second set of read operations are performed using the same read voltage, at 606. The method 600 may include computing a second set of reliability measures based on the first data and the second data, where the second set of reliability measures is different than the first set of reliability measures in at least one reliability measure, at 608. The second set of reliability measures may be provided to the ECC decoder and the ECC decoder may be activated to attempt to reconstruct the ECC codeword based at least in part on the second set of reliability measures.

By performing the multiple read operations on the storage element, effects of the statistical noise on a stored voltage of the storage element and/or on a reading voltage may be observed (e.g., realized). Accordingly, an output value associated with a storage element and/or a reliability value may be generated that each takes into account the effects of the statistical noise.

Figure 7:
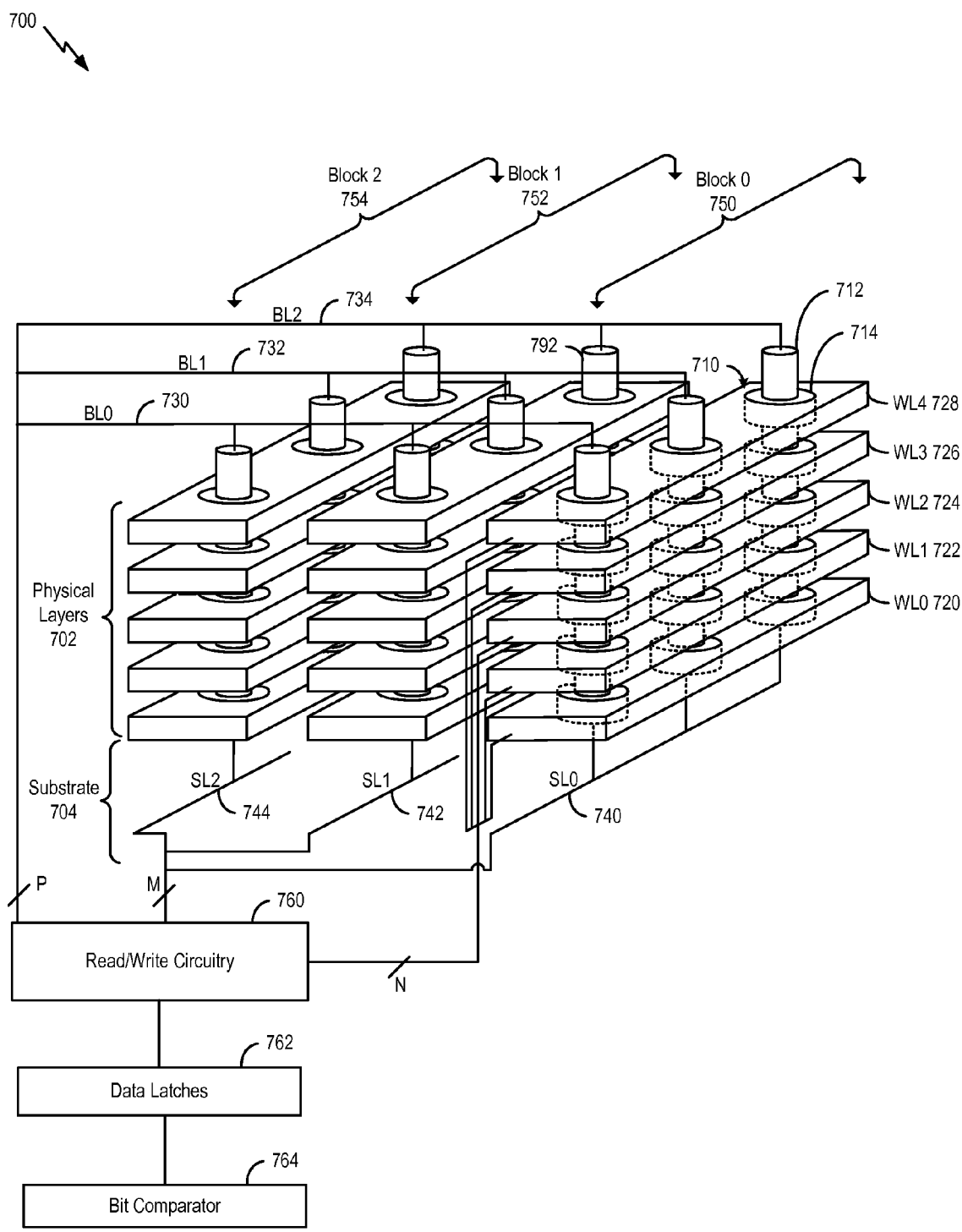
FIG. 7 is a diagram of a particular embodiment of a memory device.

FIG. 7 illustrates an embodiment of a 3D memory 700 in a NAND flash configuration. The 3D memory 700 may correspond to the memory 104 of FIG. 1. The memory 700 includes multiple physical layers, such as physical layers 702, that are monolithically formed above a substrate 704, such as a silicon substrate. Storage elements (e.g., memory cells), such as a representative memory cell 710, are arranged in arrays in the physical layers 702.

The representative memory cell 710 includes a charge trap structure 714 between a word-line/control gate (WL4) 728 and a conductive channel 712. Charge may be injected into or drained from the charge trap structure 714 via biasing of the conductive channel 712 relative to the word-line 728. For example, the charge trap structure 714 may include silicon nitride and may be separated from the word-line 728 and the conductive channel 712 by a gate dielectric, such as silicon oxide. An amount of charge in the charge trap structure 714 affects an amount of current through the conductive channel 712 during a read operation of the memory cell 710 and indicates one or more bit values that are stored in the memory cell 710.

The 3D memory 700 includes multiple erase blocks, including a first block (block 0) 750, a second block (block 1) 752, and a third block (block 2) 754. Each block 750-754 includes a "vertical slice" of the physical layers 702 that includes a stack of word-lines, illustrated as a first word-line (WL0) 720, a second word-line (WL1) 722, a third word-line (WL2) 724, a fourth word-line (WL3) 726, and the fifth word-line (WL4) 728. Multiple conductive channels (having a substantially vertical orientation with respect to FIG. 7) extend through the stack of word-lines. Each conductive channel is coupled to a storage element in each word-line 720-728, forming a NAND string of storage elements. FIG. 7 illustrates three blocks 750-754, five word-lines 720-728 in each block, and three conductive channels in each block for clarity of illustration. However, the 3D memory 700 may have more than three blocks, more than five word-lines per block, and more than three conductive channels per block.

Read/write circuitry 760 is coupled to the conductive channels via multiple conductive lines, illustrated as a first bit line (BL0) 730, a second bit line (BL1) 732, and a third bit line (BL2) 734 at a "top" end of the conducive channels (e.g., farther from the substrate 704) and a first source line (SL0) 740, a second source line (SL1) 742, and a third source line (SL2) 744) at a "bottom" end of the conductive channels (e.g., nearer to or within the substrate 704). The read/write circuitry 760 is illustrated as coupled to the bit lines 730-734 via "P" control lines, coupled to the source lines 740-744 via "M" control lines, and coupled to the word-lines 720-728 via "N" control lines. Each of P, M, and N may have a positive integer value based on the specific configuration of the 3D memory 700. In the illustrative example of FIG. 7, P=3, M=3, and N=5.

In a particular embodiment, each of the bit lines and each of the source lines may be coupled to the same end (e.g., the top end or the bottom end) of different conductive channels.

For example, a particular bit line may be coupled to the top of a conductive channel 792 and a particular source line may be coupled to the top of the conductive channel 712. The bottom of the conductive channel 792 may be coupled (e.g., electrically coupled) to the bottom of the conductive channel 712. Accordingly, the conductive channel 792 and the conductive channel 712 may be coupled in series and may be coupled to the particular bit line and the particular source line.

The read/write circuitry 760 may be configured to store data to storage elements coupled to the word-line 728 and may be configured to read bit values from the storage elements. For example, the read/write circuitry 760 may include or correspond to the read circuitry 140 of FIG. 1. To illustrate, the read/write circuitry 760 may be configured to perform the single read operation 160, the multi read operation 162, or the soft bit read operation 168 of FIG. 1, as illustrative, non-limiting examples. The bit values read from the storage elements may be provided to (e.g., stored into) the data latches 762. The bit values stored in the data latches 762 may be provided to a bit comparator 764, such as the bit comparator 124 of FIG. 1, or to a decoder (not shown), such as the decoder 122 of FIG. 1. Additionally, the read/write circuitry 760 may be configured to perform the read pulse operation 164 of FIG. 1. As another example, the read/write circuitry 760 may read bits from the data latches 762 and may apply selection signals to control lines coupled to the word-lines 720-728, the bit lines 730-734, and the source lines 740-744 to cause a programming voltage (e.g., a voltage pulse or series of voltage pulses) to be applied across selected storage element(s) of the selected word-line (e.g., the fourth word-line 728).

During a read operation, a controller, such as the controller 120 of FIG. 1, may receive a request from a host device, such as the host device 130 of FIG. 1. The controller may cause the read/write circuitry 760 to read bits from particular storage elements of the 3D memory 700 by applying appropriate signals to the control lines to cause storage elements of a selected word-line to be sensed. The logical values read from the storage elements of the selected word-line may be saved at the data latches 762 and provided to the controller.

Figure 8:
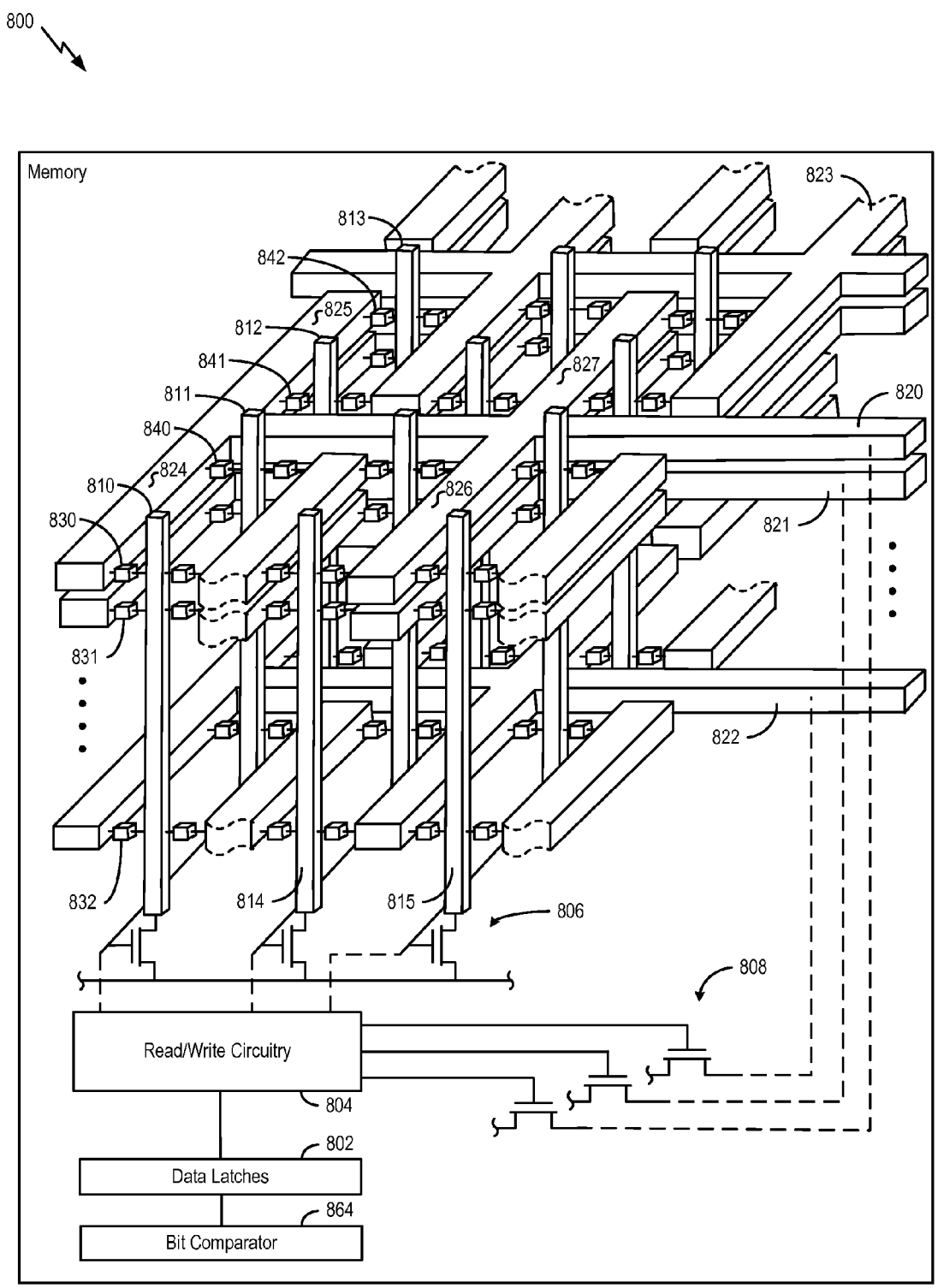
FIG. 8 is a diagram of another particular embodiment of a memory device.

FIG. 8 is a diagram of a particular embodiment of the data storage device 102 of FIG. 1. FIG. 8 illustrates a portion of a three-dimensional architecture of the memory 104 according to a particular embodiment. In the embodiment illustrated in FIG. 8, the memory 104 is a vertical bit line Resistive Random Access Memory (ReRAM) with a plurality of conductive lines in physical layers over a substrate (e.g., substantially parallel to a surface of the substrate), such as representative word-lines 820, 821, 822, and word-line 823 (only a portion of which is shown in FIG. 8) and a plurality of vertical conductive lines through the physical layers, such as representative bit lines 810, 811, 812, and 813. The memory 104 also includes a plurality of resistance-based storage elements (e.g., memory cells), such as representative storage elements 830, 831, 832, 840, 841, and 842, each of which is coupled to a bit line and a word-line in arrays of memory cells (e.g., storage elements) in multiple physical layers over the substrate (e.g., a silicon substrate). The memory 104 also includes data latches 802, read/write circuitry 804, and a bit comparator 864. The read/write circuitry 804 is coupled to word-line drivers 808 and bit line drivers 806. In a particular embodiment, the bit comparator 864 corresponds to the bit comparator 124 of FIG. 1 and the read/write circuitry 804 corresponds to the write circuitry 140 of FIG. 1. To illustrate, the read/write circuitry 804 may be configured to perform the single read operation 160, the multi read operation 162, or the soft bit read operation 168 of FIG. 1, as illustrative, non-limiting examples. Additionally, the read/write circuitry 804 may be configured to perform the read pulse operation 164 of FIG. 1.

In the embodiment illustrated in FIG. 8, each of the word-lines includes a plurality of fingers (e.g., a first word-line 820 includes fingers 824, 825, 826, and 827). Each finger may be coupled to more than one bit line. To illustrate, a first finger 824 of the first word-line 820 is coupled to a first bit line 810 via a first storage element 830 at a first end of the first finger 824 and is coupled to a second bit line 811 via a second storage element 840 at a second end of the first finger 824.

In the embodiment illustrated in FIG. 8, each bit line may be coupled to more than one word-line. To illustrate, the first bit line 810 is coupled to the first word-line 820 via the first storage element 830 and is coupled to a third word-line 822 via a third storage element 832.

During a write operation, a controller, such as the controller 120 of FIG. 1, may receive data from a host device, such as the host device 130 of FIG. 1. The controller may send the data (or a representation of the data) to the memory 800. For example, the controller may send the data (or a representation of the data) to the memory 800 to be stored in the data latches 802. The controller may encode the data prior to sending the encoded data to the data latches 802.

The read/write circuitry 804 may write the data to storage elements corresponding to the destination of the data. For example, the read/write circuitry 804 may read bits from the data latches 802 and may apply selection signals to selection control lines coupled to the word-line drivers 808 and the bit line drivers 806 to cause a write voltage to be applied across a selected storage element. For example, to select the first storage element 830, the read/write circuitry 804 may activate the word-line drivers 808 and the bit line drivers 806 to drive a programming current (also referred to as a write current) through the first storage element 830. To illustrate, a first write current may be used to write a first logical value (e.g., a value corresponding to a high-resistance state) to the first storage element 830, and a second write current may be used to write a second logical value (e.g., a value corresponding to a low-resistance state) to the first storage element 830. The programming current may be applied by generating a programming voltage across the first storage element 830 by applying a first voltage to the first bit line 810 and to word-lines other than the first word-line 820 and applying a second voltage to the first word-line 820. In a particular embodiment, the first voltage is applied to other bit lines (e.g., the bit lines 814, 815) to reduce leakage current in the memory 104.

During a read operation, the controller, such as the controller 120 of FIG. 1, may receive a request from a host device, such as the host device 130 of FIG. 1. The controller may cause the read/write circuitry 804 to read bits from particular storage elements of the memory 104 by applying selection signals to selection control lines coupled to the word-line drivers 808 and the bit line drivers 806 to cause a read voltage to be applied across a selected storage element. For example, to select the first storage element 830, the read/write circuitry 804 may activate the word-line drivers 808 and the bit line drivers 806 to apply a first voltage (e.g., 0.7 volts (V)) to the first bit line 810 and to word-lines other than the first word-line 820. A lower voltage (e.g., 0 V) may be applied to the first word-line 820. Thus, a read voltage is applied across the first storage element 830, and a read current corresponding to the read voltage may be detected at a sense amplifier of the read/write circuitry 804. The read current corresponds (via Ohm's law) to a resistance state of the first storage element 830, which corresponds to a logical value stored at the first storage element 830. The logical value read from the first storage element 830 and other elements read during the read operation may be saved at the data latches 802 and provided to the controller. For example, the logical read value may be provided to the bit comparator 864 and/or to a decoder, such as the decoder 122 of FIG. 1. Although the bit comparator 864 is illustrated as being included in the memory of FIG. 8, the bit comparator 864 may alternatively be included in the controller.

The method 300 of FIG. 3, method 400 of FIG. 4, the method 500 of FIG. 5, and/or the method 600 of FIG. 6 may be initiated or controlled by a field-programmable gate array (FPGA) device, an application-specific integrated circuit (ASIC), a processing unit, such as a central processing unit (CPU), a digital signal processor (DSP), a controller, another hardware device, a firmware device, or any combination thereof. As an example, the method 300 of FIG. 3, the method 400 of FIG. 4, the method 500 of FIG. 5, and/or the method 600 of FIG. 6 can be initiated or controlled by one or more processors included in or coupled to the data storage device 102 of FIG. 1, such as one or more processors included in or coupled to the controller 120 of FIG. 1, or one or more processors (or controllers) included in the host device 130 of FIG. 1.

A controller configured to perform the method 300 of FIG. 3, the method 400 of FIG. 4, the method 500 of FIG. 5, and/or the method 600 of FIG. 6 may be able to perform multiple read operations, such as multiple consecutive read operations, on a storage element using the same reading voltage. Although various components of the data storage device 102 depicted herein are illustrated as block components and described in general terms, such components may include one or more microprocessors, state machines, or other circuits configured to enable the controller 120, the decoder 122, the bit comparator 124, and/or the read circuitry 140 of FIG. 1 to perform operations described herein. One or more aspects of the controller 120, the decoder 122, the bit comparator 124, and/or the read circuitry 140 may be implemented using a microprocessor or microcontroller programmed to perform operations described herein, such as one or more operations of the method 300 of FIG. 3, the method 400 of FIG. 4, the method 500 of FIG. 5, the method 600 of FIG. 6, or a combination thereof. In a particular embodiment, the controller 120, the decoder 122, the bit comparator 124, and/or the read circuitry 140 includes a processor executing instructions that are stored at the memory 104. Alternatively or additionally, executable instructions that are executed by the processor may be stored at a separate memory location that is not part of the memory 104, such as at a read-only memory (ROM).

The controller 120, the decoder 122, the bit comparator 124, and/or the read circuitry 140 of FIG. 1 may be implemented using a microprocessor or microcontroller programmed to perform the method 300, the method 400 of FIG. 4, the method 500 of FIG. 5, and/or the method 600 of FIG. 6. For example, the microprocessor or microcontroller may be configured to execute instructions (e.g., a series of instructions, such as an algorithm) to perform certain operations described herein. In a particular embodiment, the controller 120, the decoder 122, the bit comparator 124, and/or the read circuitry 140 (e.g., the microprocessor or microcontroller) includes a processor executing instructions that are stored at the memory 104. Alternatively, executable instructions that are executed by the processor may be stored at a separate memory location that is not part of the memory 104, such as at a read-only memory (ROM).

In an illustrative example, the processor may execute the instructions to perform multiple read operations at a storage element of the non-volatile memory, where each read operation of the multiple read operations is performed using the same reading voltage. The instructions to perform multiple read operations may include instructions to set a read parameter, instructions to perform a first read operation based on the read parameter, instructions to generate a first read result based on the first read operation, instructions to perform a second read operation based on the read parameter, instructions to generate a second read result based on the second read operation, and/or instructions to provide the first read result and/or the second read result to a data latch, a bit comparator, or a decoder, as illustrative, non-limiting examples. The processor may also execute instructions to determine a read value of the storage element based on the multiple read operations. The instructions to determine the read value may include instructions to compare the first read result to the second read result, instructions to determine whether the first read result and the second read result have the same value, instructions to identify a majority associated with results of the multiple read operations, instructions to generate a reliability value based on multiple read operations using the same read threshold value, and/or instructions to provide the determined read value to a decoder and/or a host device, as illustrative, non-limiting examples.

In another illustrative example, the processor may execute the instructions to detect a read error associated with a first read operation at a storage element of the plurality of storage elements, where the first read operation is performed using a first read voltage. The instructions to detect the read error may include instructions to receive data read from the storage element, instructions to decode the data read from the storage device, instructions to perform one or more error code correction operations, and/or instructions to provide an indication of a detected error, as illustrative, non-limiting examples. The processor may also execute instructions to perform a second read operation at the storage element after the first read operation is performed, where the second read operation is performed using a second read voltage that is higher than the first read voltage. The instructions to perform the second read operations may include instructions to send a command to a read circuitry to perform a read pulse operation, instructions to set one or more read parameters, and/or instructions to identify one or more word-lines, strings, or blocks to receive the read pulse operation, as illustrative, non-limiting examples. The processor may further execute instructions to determine a read value of the storage element based on a third read operation at the storage element, the third read operation performed after the second read operation, where the third read operation is performed using the first read voltage. The instructions to determine the read voltage may include instructions to perform a single read operation, a multiple read operation, or a soft bit operation, instructions to set a read parameter, instructions to perform a first read operation based on the read parameter, instructions to generate a first read result based on the first read operation, instructions to perform a second read operation based on the read parameter, instructions to generate a second read result based on the second read operation, instructions to provide the first read result and/or the second read result to a data latch, a bit comparator, or a decoder, instructions to conditionally (based on decoder error) perform multiple read operation or add more read operation, instructions to generate reliability measures to an ECC decoder based on multiple read operation, instructions to generate reliability measures to an ECC decoder based on multiple read operation out of which one or more read operations are done prior to activation of an ECC decoder and one or more read operations are set if the ECC decoder fails to successfully reconstruct the data programmed to the memory, and/or instructions to decode a read value based on the third read operation, as illustrative, non-limiting examples.

In a particular embodiment, the data storage device 102 may be attached to or embedded within one or more host devices, such as within a housing of a host communication device, which may correspond to the host device 130. The data storage device 102 may be within a packaged apparatus such as a wireless telephone, a personal digital assistant (PDA), a gaming device or console, a portable navigation device, a computer device (e.g., a tablet or a laptop), or other device that uses internal non-volatile memory. However, in other embodiments, the data storage device 102 may be a portable device configured to be selectively coupled to one or more external devices, such as the host device 130. For example, the data storage device 102 may be a removable device such as a Universal Serial Bus (USB) flash drive or a removable memory card, as illustrative examples.

The host device 130 may correspond to a mobile telephone, a music player, a video player, a gaming device or console, an electronic book reader, a personal digital assistant (PDA), a computer, such as a laptop, a tablet, or a notebook computer, a portable navigation device, another electronic device, or a combination thereof. The host device 130 may communicate via a host controller, which may enable the host device 130 to communicate with the data storage device 102. The host device 130 may operate in compliance with a JEDEC Solid State Technology Association industry specification, such as an embedded MultiMedia Card (eMMC) specification, a Universal Flash Storage (UFS) Host Controller Interface specification, a Serial ATA (SATA) host interface specification, or a PCI Express (PCIe) interface standard, as illustrative, non-limiting examples. The host device 130 may operate in compliance with one or more other specifications, such as a Secure Digital (SD) Host Controller specification, as an illustrative example. Alternatively, the host device 130 may communicate with the data storage device 102 in accordance with another communication protocol.

The memory 104 may have a two-dimensional configuration, a three-dimensional (3D) configuration (e.g., a 3D memory), or any other configuration, and may include a single die or multiple dies (e.g., multiple stacked memory dies). The data storage device 102 may be configured to be coupled to the host device 130 as embedded memory, such as in connection with an embedded MultiMedia Card (eMMC®) (trademark of JEDEC Solid State Technology Association, Arlington, Va.) configuration, as an illustrative example. The data storage device 102 may correspond to an eMMC device. As another example, the data storage device 102 may correspond to a memory card, such as a Secure Digital (SD®) card, a microSD® card, a miniSD™ card (trademarks of SD-3C LLC, Wilmington, Del.), a MultiMediaCard™ (MMC™) card (trademark of JEDEC Solid State Technology Association, Arlington, Va.), a CompactFlash® (CF) card (trademark of SanDisk Corporation, Milpitas, Calif.), or a Page Perfect NAND (PPN), as illustrative, non-limiting examples. The data storage device 102 may operate in compliance with a JEDEC industry specification. For example, the data storage device 102 may operate in compliance with a JEDEC eMMC specification, a JEDEC Universal Flash Storage (UFS) specification, one or more other specifications, or a combination thereof.

Semiconductor memory devices, such as the memory 104, include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and other semiconductor elements capable of storing information. Furthermore, each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles or a charge storage dielectric material.

Multiple memory elements may be configured so that they are connected in series or such that each element is individually accessible. By way of non-limiting example, NAND devices contain memory elements (e.g., devices containing a charge storage region) connected in series. For example, a NAND memory array may be configured so that the array is composed of multiple strings of memory in which each string is composed of multiple memory elements sharing a single bit line and accessed as a group. In contrast, memory elements may be configured so that each element is individually accessible, e.g., a NOR memory array. One of skill in the art will recognize that the NAND and NOR memory configurations described have been presented as examples, and memory elements may be otherwise configured.

The semiconductor memory elements of a single device, such as elements located within and/or over the same substrate or in a single die, may be distributed in two or three dimensions, such as a two dimensional array structure or a three dimensional array structure.

In a two dimensional memory structure, the semiconductor memory elements are arranged in a single plane or single memory device level. Typically, in a two dimensional memory structure, memory elements are located in a plane (e.g., in an x-z direction plane) which extends substantially parallel to a major surface of a substrate that supports the memory elements. The substrate may be a wafer over which the layers of the memory elements are deposited and/or in which memory elements are formed or it may be a carrier substrate which is attached to the memory elements after they are formed. As a non-limiting example, the substrate may include silicon.

The memory elements may be arranged in the single memory device level in an ordered array, such as in a plurality of rows and/or columns. However, the memory elements may be arranged in non-regular or non-orthogonal configurations as understood by one of skill in the art. The memory elements may each have two or more electrodes or contact lines, such as bit lines and word-lines.

A three dimensional memory array is organized so that memory elements occupy multiple planes or multiple device levels, forming a structure in three dimensions (i.e., in the x, y and z directions, where the y direction is substantially perpendicular and the x and z directions are substantially parallel to the major surface of the substrate).

As a non-limiting example, each plane in a three dimensional memory array structure may be physically located in two dimensions (one memory level) with multiple two dimensional memory levels to form a three dimensional memory array structure. As another non-limiting example, a three dimensional memory array may be physically structured as multiple vertical columns (e.g., columns extending substantially perpendicular to the major surface of the substrate in the y direction) having multiple elements in each column and therefore having elements spanning several vertically stacked memory planes. The columns may be arranged in a two dimensional configuration (e.g., in an x-z plane), thereby resulting in a three dimensional arrangement of memory elements. One of skill in the art will understand that other configurations of memory elements in three dimensions will also constitute a three dimensional memory array.

By way of non-limiting example, in a three dimensional NAND memory array, the memory elements may be connected together to form a NAND string within a single horizontal (e.g., x-z) plane. Alternatively, the memory elements may be connected together to extend through multiple horizontal planes. Other three dimensional configurations can be envisioned wherein some NAND strings contain memory elements in a single memory level while other strings contain memory elements which extend through multiple memory levels. Three dimensional memory arrays may also be designed in a NOR configuration and in a ReRAM configuration.

A monolithic three dimensional memory array is one in which multiple memory levels are formed above and/or within a single substrate, such as a semiconductor wafer. In a monolithic three dimensional array the layers of each level of the array are formed on the layers of each underlying level of the array. One of skill in the art will understand that layers of adjacent levels of a monolithic three dimensional memory array may be shared or have intervening layers between memory levels. In contrast, two dimensional arrays may be formed separately and then packaged together to form a non-monolithic memory device. For example, non-monolithic stacked memories have been constructed by forming memory levels on separate substrates and adhering the memory levels atop each other. The substrates may be thinned or removed from the memory levels before bonding, but as the memory levels are initially formed over separate substrates, such memories are not monolithic three dimensional memory arrays. Further, multiple two dimensional memory arrays or three dimensional memory arrays (monolithic or non-monolithic) may be formed separately and then packaged together to form a stacked-chip memory device.

In some implementations, the memory 104 is a non-volatile memory having a three-dimensional (3D) memory configuration that is monolithically formed in one or more physical levels of arrays of memory cells having an active area disposed above a silicon substrate. The data storage device 102 includes circuitry, such as the read circuitry 140 and/or the write circuitry of FIG. 1, as an illustrative, non-limiting example, associated with operation of the memory cells.

Associated circuitry is typically used for operation of the memory elements and for communication with the memory elements. This associated circuitry may be on the same substrate as the memory array and/or on a separate substrate. As non-limiting examples, the memory devices may have driver circuitry and control circuitry used in the programming and reading of the memory elements.

One of skill in the art will recognize that this disclosure is not limited to the two dimensional and three dimensional structures described but cover all relevant memory structures within the spirit and scope of the disclosure as described herein and as understood by one of skill in the art.

The Abstract of the Disclosure is submitted with the understanding that it will not be used to interpret or limit the scope or meaning of the claims. In addition, in the foregoing Detailed Description, various features may be grouped together or described in a single embodiment for the purpose of streamlining the disclosure. This disclosure is not to be interpreted as reflecting an intention that the claimed embodiments require more features than are expressly recited in each claim. Rather, as the following claims reflect, inventive subject matter may be directed to less than all of the features of any of the disclosed embodiments.

The illustrations of the embodiments described herein are intended to provide a general understanding of the various embodiments. Other embodiments may be utilized and derived from the disclosure, such that structural and logical substitutions and changes may be made without departing from the scope of the disclosure. This disclosure is intended to cover any and all subsequent adaptations or variations of various embodiments.

The above-disclosed subject matter is to be considered illustrative, and not restrictive, and the appended claims are intended to cover all such modifications, enhancements, and other embodiments, which fall within the scope of the present disclosure. Thus, to the maximum extent allowed by law, the scope of the present disclosure is to be determined by the broadest permissible interpretation of the following claims and their equivalents, and shall not be restricted or limited by the foregoing detailed description.

What is claimed is:

1. A method comprising:
   in a data storage device including a controller and a non-volatile memory, wherein the non-volatile memory includes a plurality of storage elements:
      performing multiple read operations at a storage element of the non-volatile memory, wherein each read operation of the multiple read operations is performed using a same reading voltage;
      generating a read value of the storage element based on the multiple read operations; and
      in response to a difference between a first number of results of the multiple read operations having a first value and a second number of results of the multiple read operations having a second value, assigning a reliability value to the read value based on a relationship between the first number of results and a combination of the first number of results and the second number of results.

2. The method of claim 1, further comprising determining the reliability value corresponding to the read value, wherein the reliability value corresponds to a ratio of the first number of results to a sum of the first number of results and the second number of results.

3. The method of claim 2, further comprising providing the read value and the reliability value to a decoder.

4. The method of claim 1, further comprising applying a voltage pulse on one or more word-lines prior to performing the multiple read operations, the one or more word-lines including a particular word-line that includes the storage element, wherein a pulse voltage of the voltage pulse is greater than the same reading voltage used during each of the multiple read operations.

5. The method of claim 4, wherein application of the voltage pulse is configured to promote release of one or more electrons trapped in an oxide layer associated with the storage element.

6. The method of claim 4, wherein the applying the voltage pulse is performed in response to detecting a read error associated with a first read operation at the storage element, and wherein the first read operation is performed using the same reading voltage.

7. The method of claim 6, wherein, based on the read error, voltage pulses are applied on multiple word-lines associated with the particular word-line, and wherein pulse voltages of each of the voltage pulses are greater than the same reading voltage.

8. The method of claim 1, further comprising:
determining, based on the multiple read operations, the first number of results having the first value; and
determining, based on the multiple read operations, the second number of results having the second value.

9. The method of claim 8, further comprising applying one or more additional read operations using the same reading voltage when the first number of results and the second number of results are equal.

10. The method of claim 1, further comprising performing multiple second read operations at a second storage element of the non-volatile memory, wherein each read operation of the multiple second read operations is performed using a same second reading voltage.

11. The method of claim 10, further comprising:
determining a first reliability value associated with the storage element, wherein, when each of the multiple read operations generates a same result value, the first reliability value is determined based on a soft read operation; and
determining a second reliability value corresponding to a second read value associated with the second storage element, wherein, when at least two of the multiple second read operations generate different result values, the second reliability value is determined based on the multiple second read operations.

12. The method of claim 1, wherein the non-volatile memory includes a three-dimensional (3D) memory configuration that is monolithically formed in one or more physical levels of arrays of memory cells having an active area disposed above a silicon substrate, and wherein the data storage device includes circuitry associated with operation of the memory cells.

13. The method of claim 1, further comprising determining that the first number of results and the second number of results are different, wherein the read value corresponds to the larger of the first number of results and the second number of results.

14. The method of claim 1, further comprising determining that the first number of results and the second number of results are the same, wherein the read value is assigned a random value.

15. A data storage device comprising:
a non-volatile memory including a plurality of storage elements; and
a controller operatively coupled to the non-volatile memory, wherein the controller is configured to initiate multiple read operations at a storage element of the non-volatile memory, wherein each read operation of the multiple read operations is performed using a same reading voltage, wherein the controller is further configured to generate a read value of the storage element based on the multiple read operations, and wherein the controller is further configured to, in response to a difference between a first number of results of the multiple read operations having a first value and a second number of results of the multiple read operations having a second value, assign a reliability value to the read value based on a relationship between the first number of results and a combination of the first number of results and the second number of results.

16. The data storage device of claim 15, wherein the controller is further configured to determine the reliability value corresponding to the read value, wherein the reliability value corresponds to a ratio of the first number of results to a sum of the first number of results and the second number of results.

17. The data storage device of claim 15, wherein the controller is further configured to initiate a voltage pulse to be applied on one or more word-lines prior to performing the multiple read operations.

18. The data storage device of claim 17, further comprising a decoder included in the controller, wherein the decoder is configured to detect a read error associated with a first read operation at the storage element, the first read operation prior to the multiple read operations.

19. The data storage device of claim 18, wherein the voltage pulse is initiated in response to a read error being detected.

20. The data storage device of claim 15, wherein the controller is further configured to perform a comparison between a first result value of a first read operation of the multiple read operations and a second result value of a second read operation of the multiple read operations.

21. The data storage device of claim 20, wherein the controller is configured to determine, based on the comparison, the reliability value corresponding to the read value of the storage element.

22. The data storage device of claim 20, wherein, based on the comparison, the controller is configured to initiate one or more additional read operations at the storage element using the same reading voltage.

23. The data storage device of claim 15, wherein the controller is configured to determine a first reliability value associated with the storage element, wherein, when each of the multiple read operations generates a same result value, the first reliability value is determined based on a soft read operation.

24. The data storage device of claim 23, wherein the controller is configured to perform multiple second read operations at a second storage element of the non-volatile memory, wherein each read operation of the multiple second read operations is performed using a same second reading voltage, wherein the storage element and the second storage element are associated with a same physical page, and wherein the controller is further configured to determine a second reliability value associated with the second storage element, the second reliability value determined based on the multiple read operations.

25. The data storage device of claim 24, further comprising a decoder, wherein the first reliability value and the second reliability value are received by the decoder.

26. The data storage device of claim 15, wherein the non-volatile memory includes a three-dimensional (3D) memory configuration that is monolithically formed in one or more physical levels of arrays of memory cells having an active area disposed above a silicon substrate, and wherein the data storage device includes circuitry associated with operation of the memory cells.

27. A method comprising: in a data storage device including a controller and a memory, wherein the memory includes a plurality of storage elements: performing a first set of read operations at a storage element of the plurality of storage elements to generate first data; computing a first set of reliability measures based on the first set of read operations; in response to an unsuccessful decode operation of the first data, performing a second set of read operations at the storage element to generate second data, wherein at least one read operation of the first set of read operations and at least one read operation of the second set of read operations are performed using a same read voltage; and computing a second set of reliability measures based on the first data and the second data, wherein the second set of reliability measures is different than the first set of reliability measures in at least one reliability measure, and wherein, responsive to a difference between a first number of results of the second set of read operations having a first value and a second number of results of the second set of read operations having a second value, a reliability measure of the second set of reliability measures is based on a relationship between the first number of results and a combination of the first number of results and the second number of results.

28. The method of claim 27, wherein the first set of read operations includes one or more read operations.

29. The method of claim 27, further comprising:
encoding information data into an error correction code (ECC) codeword; and
storing at least a portion of the ECC codeword at the storage element.

30. The method of claim 27, further comprising transferring the first data from the memory to the controller.

31. The method of claim 27, further comprising:
providing the first set of reliability measures to an error correction code (ECC) decoder; and
activating the ECC decoder to attempt to reconstruct an ECC codeword based at least in part on the first data, the first set of reliability measures, or a combination thereof.

32. The method of claim 31, further comprising:
providing the second set of reliability measures to the ECC decoder; and
activating the ECC decoder to attempt to reconstruct the ECC codeword based at least in part on the second set of reliability measures.

33. The method of claim 27, wherein the memory includes a non-volatile memory.

34. The method of claim 27, wherein the memory includes a three-dimensional (3D) memory configuration that is monolithically formed in one or more physical levels of arrays of memory cells having an active area disposed above a silicon substrate, and wherein the data storage device includes circuitry associated with operation of the memory cells.

35. A data storage device comprising: a memory including a plurality of storage elements; and a controller operatively coupled to the memory, wherein the controller is configured to generate first data based on a first set of read operations performed at a storage element of the plurality of storage elements and to compute a first set of reliability measures based on the first set of read operations, wherein the controller is further configured to, in response to an unsuccessful decode operation of the first data, generate second data based on a second set of read operations performed at the storage element and to compute a second set of reliability measures based on the first data and the second data, wherein at least one read operation of the first set of read operations and at least one read operation of the second set of read operations are performed using a same read voltage, wherein the second set of reliability measures is different than the first set of reliability measures in at least one reliability measure, and wherein, responsive to a difference between a first number of results of the second set of read operations having a first value and a second number of results of the second set of read operations having a second value, a reliability measure of the second set of reliability measures is based on a relationship between the first number of results and a combination of the first number of results and the second number of results.

36. The data storage device of claim 35, wherein the first set of read operations includes one or more read operations, and wherein the second set of read operations includes one or more read operations.

37. The data storage device of claim 35, wherein the controller is configured to encode information data into an error correction code (ECC) codeword and to store at least a portion of the ECC codeword at the storage element.

38. The data storage device of claim 35, wherein the controller includes an error correction code (ECC) decoder configured to perform one or more decode operations, and where in the controller is configured to provide the first data and the first set of reliability measures to the ECC decoder.

39. The data storage device of claim 38, wherein the controller is configured to activate the ECC decoder to attempt to reconstruct an ECC codeword based at least in part on the first data, the first set of reliability measures, or a combination thereof.

40. The data storage device of claim 38, wherein the controller is configured to provide the second set of reliability measures to the ECC decoder and to activate the ECC decoder to attempt to reconstruct an ECC codeword based at least in part on the second set of reliability measures.

41. The data storage device of claim 35, wherein the memory includes a non-volatile memory.

42. The data storage device of claim 35, wherein the memory includes a three-dimensional (3D) memory configuration that is monolithically formed in one or more physical levels of arrays of memory cells having an active area disposed above a silicon substrate, and wherein the data storage device includes circuitry associated with operation of the memory cells.

43. An apparatus comprising:
means for performing multiple read operations at a storage element of a plurality of storage elements, wherein each read operation of the multiple read operations is performed using a same reading voltage; and
means for generating a read value of the storage element based on the multiple read operations and for assigning a reliability value to the read value, wherein, in response to a difference between a first number of results of the multiple read operations having a first value and a second number of results of the multiple read operations having a second value, the reliability value is assigned based on a relationship between the first number of results and a combination of the first number of results and the second number of results.

44. The apparatus of claim 43, wherein the combination of the first number of results and the second number of results comprises a total number of results of the multiple read operations, and wherein the reliability value is assigned based on a ratio of the first number of results and the total number of results.

45. An apparatus comprising: means for performing a first set of read operations at a storage element of a plurality of storage elements to generate first data and, in response to an unsuccessful decode operation of the first data, performing a second set of read operations at the storage element to generate second data, wherein at least one read operation of the first set of read operations and at least one read operation of the second set of read operations are performed using a same read voltage; and means for computing a first set of reliability measures based on the first set of read operations and for computing a second set of reliability measures based on the first data and the second data, wherein the second set of reliability measures is different than the first set of reliability measures in at least one reliability measure, and wherein, responsive to a difference between a first number of results of the second set of read operations having a first value and a second number of results of the second set of read operations having a second value, a reliability measure of the second set of reliability measures is based on a relationship between the first number of results and a combination of the first number of results and the second number of results.

46. The apparatus of claim 45, wherein the reliability measure is assigned based on a ratio of the second number of results to a sum of the first number of results and the second number of results.

* * * * *